US012710832B2

(12) United States Patent
Matsuda

(10) Patent No.: US 12,710,832 B2
(45) Date of Patent: Aug. 18, 2026

(54) ELECTROMAGNETIC INDUCTION PEN AND POSITION DETECTING DEVICE

(71) Applicant: Wacom Co., Ltd., Saitama (JP)

(72) Inventor: Yosuke Matsuda, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 18/945,283

(22) Filed: Nov. 12, 2024

(65) Prior Publication Data

US 2025/0068265 A1 Feb. 27, 2025

Related U.S. Application Data

(63) Continuation of application No. PCT/JP2022/046168, filed on Dec. 15, 2022.

(30) Foreign Application Priority Data

May 20, 2022 (JP) ................................ 2022-082825

(51) Int. Cl.
*G06F 3/0354* (2013.01)
*G06F 3/038* (2013.01)
(Continued)

(52) U.S. Cl.
CPC ........ *G06F 3/03545* (2013.01); *G06F 3/0383* (2013.01); *G06F 3/04162* (2019.05); *G06F 3/046* (2013.01); *H03H 11/02* (2013.01)

(58) Field of Classification Search
CPC ............... G06F 3/03545; G06F 3/0383; G06F 3/04162; G06F 3/046; G06F 3/03; G06F 3/038; H03H 11/02; H02J 50/12
See application file for complete search history.

(56) References Cited

U.S. PATENT DOCUMENTS 5,629,500 A * 5/1997 Fukuzaki ............ G06F 3/03545 178/19.07
5,679,930 A * 10/1997 Katsurahira ............ G06F 3/041 340/8.1

(Continued)

FOREIGN PATENT DOCUMENTS

| | | | |
|---|---|---|---|
| JP | S6370326 | A | 3/1988 |
| JP | H07175572 | A | 7/1995 |
| JP | H07182094 | A | 7/1995 |

OTHER PUBLICATIONS

J.-S. An et al., "A 3.9-kHz Frame Rate and 61.0-dB SNR Analog Front-End IC With 6-bit Pressure and Tilt Angle Expressions of Active Stylus Using Multiple-Frequency Driving Method for Capacitive Touch Screen Panels," in IEEE Journal of Solid-State Circuits, vol. 53, No. 1, pp. 187-203, Jan. 2018 (Year: 2018).*

(Continued)

*Primary Examiner* — Bryan Earles
(74) *Attorney, Agent, or Firm* — Seed Intellectual Property Law Group LLP

(57) ABSTRACT

An electromagnetic induction pen of an electromagnetic induction system (EMR) system that can achieve a multi-level pen signal. The electromagnetic induction pen includes a resonance circuit that transmits a pen signal by using power obtained from an alternating magnetic field sent out by a position detecting device, and a control circuit that causes the resonance circuit to transmit the pen signal phase-modulated according to information to be transmitted to the position detecting device, by temporarily changing a resonance frequency of the resonance circuit from a first frequency to a second frequency different from the first frequency based on the information and then returning the resonance frequency of the resonance circuit 23 to the first frequency.

17 Claims, 25 Drawing Sheets

(51) Int. Cl.

| | |
|---|---|
| ***G06F 3/041*** | (2006.01) |
| ***G06F 3/046*** | (2006.01) |
| ***H03H 11/02*** | (2006.01) |

(56) References Cited

U.S. PATENT DOCUMENTS 5,898,136 A * 4/1999 Katsurahira ............ G06F 3/046
345/173
2020/0293121 A1* 9/2020 Matsui ................ G06F 3/04162

OTHER PUBLICATIONS

International Search Report, dated Feb. 28, 2023, for International Application PCT/JP2022/046168. (2 pages) (English Translation).

* cited by examiner

ELECTROMAGNETIC INDUCTION PEN AND POSITION DETECTING DEVICE

BACKGROUND

Technical Field

The present disclosure relates to an electromagnetic induction pen and a position detecting device, and particularly relates to an electromagnetic induction pen and a position detecting device that support position detection by an electromagnetic induction system.

Description of the Related Art

The electromagnetic induction system (EMR system) is known as one of systems for detecting the position of an electromagnetic induction pen within a panel surface of a tablet terminal or the like. The electromagnetic induction pen using the EMR system includes a resonance circuit including a coil provided to a pen tip and a capacitor. On the other hand, the tablet terminal using the EMR system is provided with a position detecting device for detecting the position of the electromagnetic induction pen. The position detecting device includes a plurality of loop coils arranged within the panel surface and a sensor controller connected to these plurality of loop coils.

The position detecting device has a function of sending out an alternating magnetic field from the panel surface by passing an alternating current through one or more loop coils. When the coil within the electromagnetic induction pen enters the alternating magnetic field, electromagnetic induction induces an electromotive force in the coil. The electromagnetic induction pen is configured to transmit a signal indicating information (for example, a pen pressure value) (which signal will hereinafter be referred to as a “pen signal”) to the position detecting device by controlling a resonance characteristic of the resonance circuit while using power obtained from the electromotive force after the position detecting device stops sending out the alternating magnetic field. The position detecting device is configured to obtain the information transmitted by the electromagnetic induction pen, by demodulating the pen signal appearing in a form of an alternating current in loop coils. Patent Documents 1 and 2 disclose examples of the electromagnetic induction pen that transmits the pen signal.

PRIOR ART DOCUMENT

Patent Documents

Patent Document 1: Japanese Patent Laid-Open No. H07-175572

Patent Document 2: Japanese Patent Laid-Open No. H07-182094

BRIEF SUMMARY

Technical Problem

However, in the conventional EMR system, the information that the electromagnetic induction pen can transmit by the pen signal at a time is merely information of one bit, and simultaneous transmission of information of a plurality of bits (that is, the achievement of a multilevel pen signal) as in quadrature phase shift keying (QPSK) or 16 quadrature amplitude modulation (16QAM) used in mobile communication cannot be realized.

Making brief description of reasons therefor, first, as an assumption, when the electromagnetic induction pen is to transmit information of n bits at the same time in the EMR system, the electromagnetic induction pen changes the resonance frequency of the resonance circuit included therein, in $2^n$ manners. The transmission of the pen signal by the electromagnetic induction pen is performed in a state in which synchronism with the position detecting device is established. The position detecting device can therefore demodulate the pen signal by detecting a change in the phase of the pen signal.

Here, the reception of the pen signal by the position detecting device is performed by quadrature detection (discrete Fourier transform) at a predetermined frequency. However, the quadrature detection has such a characteristic that a reception level is decreased as the frequency of the received signal is shifted from the above-described predetermined frequency. As a result, with the conventional EMR system, the resonance frequency of the resonance circuit within the electromagnetic induction pen cannot be greatly changed from the above-described predetermined frequency. This has been a hindrance to the achievement of a multilevel pen signal.

Embodiments of the present disclosure provide an electromagnetic induction pen and a position detecting device of the EMR system that can achieve a multilevel pen signal.

Technical Solution

An electromagnetic induction pen according to the present disclosure is an electromagnetic induction pen including a resonance circuit that, in operation, transmits a pen signal) by using power obtained from an alternating magnetic field sent out by a position detecting device, and a control circuit that, in operation, causes the resonance circuit to transmit the pen signal phase-modulated according to information to be transmitted to the position detecting device, by temporarily changing a resonance frequency of the resonance circuit from a first frequency to a second frequency different from the first frequency based on the information and then returning the resonance frequency of the resonance circuit to the first frequency.

A position detecting device according to the present disclosure includes a plurality of loop coils, and a sensor controller that, in operation, sends out an alternating magnetic field of a first frequency by using at least one of the loop coils, and, after stopping sending out the alternating magnetic field, demodulates information transmitted by an electromagnetic induction pen based on a phase of a signal of the first frequency detected within a pen signal detection period.

Advantageous Effect

According to the present disclosure, the phase of the pen signal transmitted at the first frequency can be controlled by the information as a transmission target. It is therefore possible to achieve a multilevel pen signal without causing a decrease in reception level in quadrature detection of the position detecting device.

BRIEF DESCRIPTION OF DESCRIPTION OF THE RELATED DRAWINGS

FIG. 5 is a diagram illustrating a specific example of a configuration of a modulation circuit 25 illustrated in FIG. 4.

FIG. 6 is a diagram illustrating simulation waveforms of an alternating current v1, a voltage signal comp, a control signal din, and a control signal swc1 according to the first embodiment of the present disclosure.

FIG. 11 is a diagram illustrating a specific example of a configuration of a modulation circuit 25 illustrated in FIG. 10.

DETAILED DESCRIPTION

Principles of the present disclosure will first be described with reference to the accompanying FIGS. 1A to 1C.

Figure 1A:
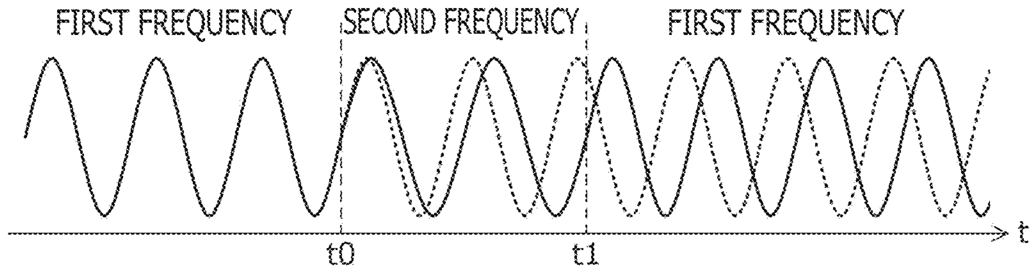
FIGS. 1A to 1C depict diagrams of assistance in explaining principles of the present disclosure.
Figure 1B:
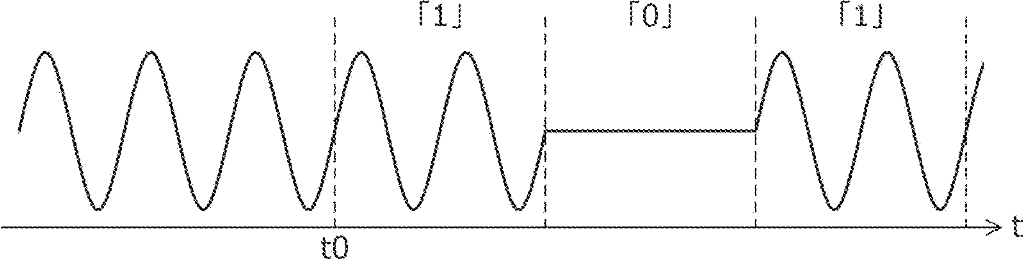
Figure 1C:
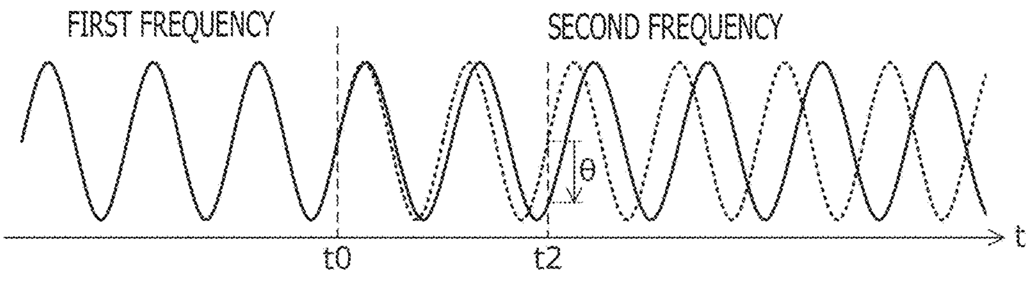

FIGS. 1A to 1C depict diagrams of assistance in explaining principles of the present disclosure. FIG. 1A illustrates the waveform of a pen signal according to the present disclosure. FIG. 1B illustrates the waveform of a pen signal according to an example of the background art of the present disclosure. FIG. 1C illustrates the waveform of a pen signal according to another example of the background art of the present disclosure. Time t0 in each figure indicates a timing at which the sending out of an alternating magnetic field by a position detecting device is ended.

In a case of modulating a pen signal according to information to be transmitted to the position detecting device, modulations as those in FIG. 1B and FIG. 1C have hitherto been performed. Making brief description of each, first, FIG. 1B represents an example of using on-off modulation. In the present example, a switch element is provided in parallel with a capacitor of a resonance circuit within an electromagnetic induction pen. When the switch element is set in an on state, the capacitor is short-circuited, and therefore, the resonance circuit ceases to be formed. The transmission of the pen signal is consequently stopped. The position detecting device demodulates the pen signal, assuming that a state in which the pen signal is detected by the above-described quadrature detection is "1" and that a state in which the pen signal is not detected is "0."

FIG. 1C represents an example of using pseudo phase modulation. In the present example, a variable capacitance capacitor that changes in capacitance according to a pen pressure value, for example, is used as a part of the capacitor of the resonance circuit within the electromagnetic induction pen. A change in the capacitance of the variable capacitance capacitor changes the resonance frequency of the resonance circuit. Thus, a pen signal that oscillates at a second frequency different from a first frequency equal to the frequency of an alternating magnetic field AM is transmitted, as in an example indicated by a solid line in FIG. 1C. The position detecting device is configured to derive a phase θ of the pen signal from the value of the pen signal at time t2, at which predetermined time has passed from time t0, and obtain the pen pressure value transmitted by the electromagnetic induction pen, on the basis of the derived phase θ. The present example derives the phase θ in the position detecting device, and may therefore be conventionally referred to as "phase modulation." However, it is the resonance frequency that is actually modulated, and the phase modulation in a proper sense is not performed.

The on-off modulation illustrated in FIG. 1B has a problem in that the larger the amount of information to be transmitted, the more time the transmission takes. Though not illustrated in FIG. 1B, the actual pen signal is gradually attenuated after time t0. Hence, it is impossible in actuality to perform the transmission over an extended period of time. As a result, the on-off modulation illustrated in FIG. 1B also limits the amount of information to be transmitted. On the other hand, the pseudo phase modulation illustrated in FIG. 1C has a problem in that the resonance frequency of the resonance circuit within the electromagnetic induction pen cannot be greatly changed due to the characteristic of the above-described quadrature detection (such a characteristic that the reception level is decreased as the frequency of the received signal is shifted from a predetermined frequency) and this hinders the achievement of a multilevel pen signal.

On the other hand, as illustrated in FIG. 1A, the electromagnetic induction pen according to the present disclosure performs processing of temporarily changing the resonance frequency of the resonance circuit from a first frequency (frequency of the alternating magnetic field=center frequency of the quadrature detection performed by the position detecting device) to a second frequency (≠ the first frequency) (during a period from time t0 to time t1 in the example of FIG. 1) on the basis of the information as a transmission target and then returning the resonance frequency of the resonance circuit to the first frequency. Specifically, the value of the capacitance of a capacitor constituting the resonance circuit may be changed on the basis of the information as the transmission target, the length of a period of maintaining a state in which the capacitance of a capacitor constituting the resonance circuit is changed may be changed on the basis of the information as the transmission target, or the capacitance of a capacitor constituting the resonance circuit may be changed by another method. In addition, the inductance of a coil constituting the resonance circuit may be changed on the basis of the information as the transmission target. Each of the processes provides a pen signal that oscillates at the first frequency and is phase-modulated in a proper sense on the basis of the information as the transmission target, after the resonance frequency is returned to the first frequency. Hence, according to the present disclosure, it is possible to achieve a multilevel pen signal without causing a decrease in the reception level in the quadrature detection of the position detecting device.

In the following, embodiments of the present disclosure will be described in detail with reference to FIGS. 2 to 25. In the following, a case of changing the capacitance of a capacitor constituting the resonance circuit in order to change the resonance frequency of the resonance circuit will be taken as an example, and first to fifth embodiments representing specific changing methods that differ from one another will be described.

Figure 2:
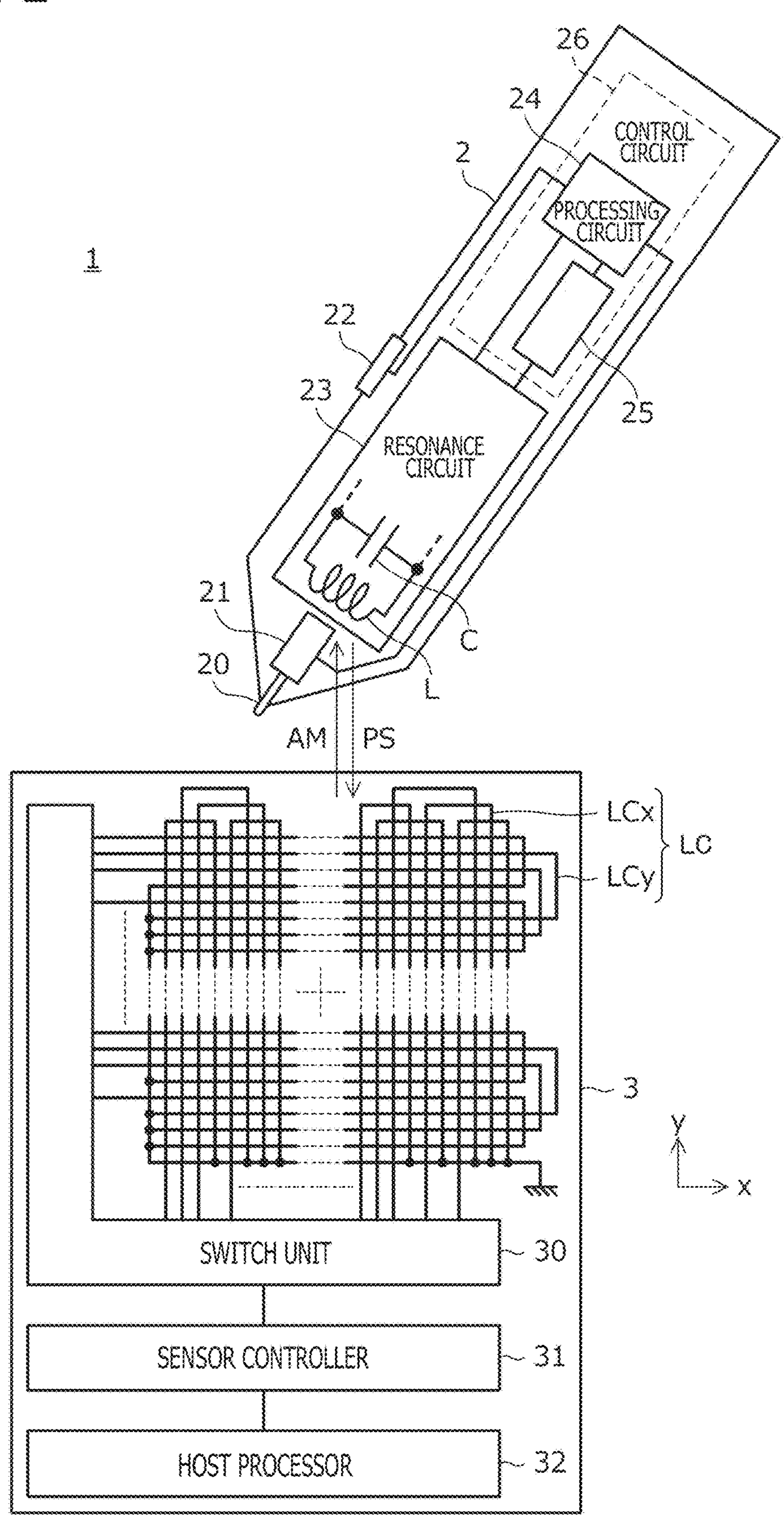
FIG. 2 is a diagram illustrating a configuration of a position detection system 1 according to a first embodiment of the present disclosure.

FIG. 2 is a diagram illustrating a configuration of a position detection system 1 according to the first embodiment of the present disclosure. As illustrated in the figure, the position detection system 1 includes an electromagnetic induction pen 2 and a position detecting device 3 that each support the EMR system. Of these, the electromagnetic induction pen 2 is a pen type device including a core body 20, a pressure sensor 21, a side switch 22, a resonance circuit 23, and a control circuit 26. In the following, an alternating magnetic field sent out by the position detecting device 3 will be referred to as an "alternating magnetic field AM," and a signal transmitted to the position detecting device 3 by the electromagnetic induction pen 2 will be referred to as a "pen signal PS."

The core body 20 is a rod-shaped member constituting a pen tip of the electromagnetic induction pen 2. The core body 20 is configured to be movable in the axial direction of the pen. A rear end of the core body 20 abuts against the pressure sensor 21. The pressure sensor 21 is a sensor that detects a pressure applied to the pen tip, by detecting a pressing force from the rear end of the core body 20. The pressure sensor 21 is configured to supply a value indicating the detected pressure (pen pressure value) to a processing circuit 24.

The side switch 22 is an on-off switch provided on a surface of the electromagnetic induction pen 2. The side switch 22 is configured to supply information indicating an on/off state of the side switch 22 itself (on/off information) to the processing circuit 24. Incidentally, while FIG. 2 illustrates an example in which the electromagnetic induction pen 2 has one side switch 22, the electromagnetic induction pen 2 may have a plurality of side switches 22. In addition, a similar switch may be provided to a surface other than the side surface of the electromagnetic induction pen 2 (for example, a tail end portion).

The resonance circuit 23 is an integrated circuit including an LC resonance circuit constituted by a coil L and a capacitor C connected in series with each other. However, some or all of the parts constituting the resonance circuit 23 may be constituted by an element outside the integrated circuit. The same is true for the processing circuit 24 and a modulation circuit 25 to be described later.

The coil L is a part that is provided in the vicinity of the pen tip and is magnetically coupled to loop coils LC (to be described later) within the position detecting device 3. When the coil L enters the alternating magnetic field AM, electromagnetic induction induces an electromotive force in the coil L. Consequently, an alternating current is generated within the resonance circuit 23, and power is stored in the capacitor C. The resonance circuit 23 plays a role of supplying the generated alternating current to the processing circuit 24 and transmitting a pen signal PS as a reflection signal by using the power stored in the capacitor C, after the alternating magnetic field AM disappears.

The control circuit 26 is a circuit that makes the resonance circuit 23 transmit the pen signal PS phase-modulated according to information to be transmitted to the position detecting device 3, by temporarily changing the resonance frequency of the resonance circuit 23 from the first frequency to the second frequency on the basis of the information and then returning the resonance frequency of the resonance circuit 23 to the first frequency. Specifically, after the sending out of the alternating magnetic field AM by the position detecting device 3 is ended, the processing of changing the resonance frequency of the resonance circuit 23 from the first frequency to the second frequency on the basis of the above-described information is performed by temporarily changing the capacitance of the capacitor C from a first capacitance to a second capacitance on the basis of the above-described information. The control circuit 26 includes the processing circuit 24 and the modulation circuit 25. The control circuit 26 is configured to perform this processing by the processing circuit 24 and the modulation circuit 25.

The processing circuit 24 is an integrated circuit that obtains a command transmitted by the position detecting device 3 by demodulating the alternating current supplied from the resonance circuit 23, determines the content of information (digital information) to be transmitted to the position detecting device 3, and controls the resonance circuit 23 and the modulation circuit 25 to transmit the information having the determined content by the pen signal PS. Specific examples of the information to be transmitted include data for response to the command, the pen pressure value supplied from the pressure sensor 21, the on/off information supplied from the side switch 22, and the like.

The modulation circuit 25 is an integrated circuit that controls the phase of the pen signal PS remaining after returning the capacitance of the capacitor C to the first capacitance, by temporarily changing the capacitance of the capacitor C from the first capacitance to the second capacitance (≠ the first capacitance) according to control of the processing circuit 24 after the sending out of the alternating magnetic field AM by the position detecting device 3 is ended. The resonance circuit 23 according to the present embodiment is configured to be able to select one second capacitance from among a plurality of second capacitances different from each other. The processing circuit 24 makes this selection (that is, controls the value of the second capacitance) on the basis of the information determined as a transmission target. The phase control of the pen signal PS based on the information as the transmission target is thereby implemented. Details of this will be described later.

The position detecting device 3 is a device including a plurality of loop coils LC, a switch unit 30, a sensor controller 31, and a host processor 32. The position detecting device 3 according to a typical example is a tablet terminal or a notebook personal computer having a display surface serving also as a touch surface. However, the position detecting device 3 may be constituted by a digitizer or the like not having the display surface.

The plurality of loop coils LC are coils arranged within the touch surface. The plurality of loop coils LC include a plurality of loop coils LCx juxtaposed with each other along an x-direction and a plurality of loop coils LCy juxtaposed with each other along a y-direction. Each of the loop coils LC has one end connected to the switch unit 30, and has another end grounded. The switch unit 30 is a circuit that plays a role of connecting one or more of the plurality of loop coils LC to the sensor controller 31 according to control of the sensor controller 31.

The sensor controller 31 is an integrated circuit that has a function of detecting the position of the electromagnetic induction pen 2 within the touch surface, obtaining data transmitted by the electromagnetic induction pen 2 by the pen signal PS, and sequentially supplying the detected position and the obtained data to the host processor 32. In order to perform these processes, the sensor controller 31 is configured to send out the alternating magnetic field AM and receive the pen signal PS via the plurality of loop coils LC. Of these, the reception of the pen signal PS is performed by the sensor controller 31 setting, as a period of detection of the pen signal PS, a predetermined period which is after the sending out of the alternating magnetic field AM is stopped, and subjecting a voltage signal appearing in the loop coils LC in this detection period to quadrature detection at a predetermined frequency (discrete Fourier transform).

The sensor controller 31 is configured to perform different processing between a stage in which the electromagnetic induction pen 2 is not detected yet (global scanning) and a stage in which the electromagnetic induction pen 2 is already detected (local scanning). In the global scanning, the sensor controller 31 sends out the alternating magnetic field AM from each of the plurality of loop coils LC in order, and each time performs processing of sequentially scanning each loop coil LC after ending the sending out of the alternating magnetic field AM. When the pen signal PS is detected in any one of the loop coils LC as a result of the processing, the position of the electromagnetic induction pen 2 is derived on the basis of the reception strength of the pen signal PS in each loop coil LC, and a transition is made to the local scanning.

The sensor controller 31 after making a transition to the local scanning performs processing of selecting a plurality of loop coils LCx and a plurality of loop coils LCy located in the vicinity of the latest position of the electromagnetic induction pen 2, sending out the alternating magnetic field AM from each of the selected plurality of loop coils LCx in order, and each time sequentially scanning the selected plurality of loop coils LCy after ending the sending out of the alternating magnetic field AM. When the pen signal PS is detected in any one of the loop coils LCy as a result of the processing, the position of the electromagnetic induction pen 2 is derived on the basis of the reception strength of the pen signal PS in each loop coil LCy, and the information transmitted by the electromagnetic induction pen 2 is obtained by demodulating the pen signal PS received in a loop coil LCy corresponding to a highest reception strength. When the pen signal PS is not detected in any one of the loop coils LCy, the sensor controller 31 makes a transition to the global scanning, and performs the processing of the above-described global scanning.

With regard to the demodulation of the pen signal PS, the sensor controller 31 stores, in advance, a table that associates the phase of the pen signal PS and information of a predetermined number of bits with each other. Moreover, the sensor controller 31 is configured to detect the phase of the received pen signal PS by quadrature detection and obtain the information transmitted by the electromagnetic induction pen 2, by searching the above-described table on the basis of the detected phase.

Figure 3:
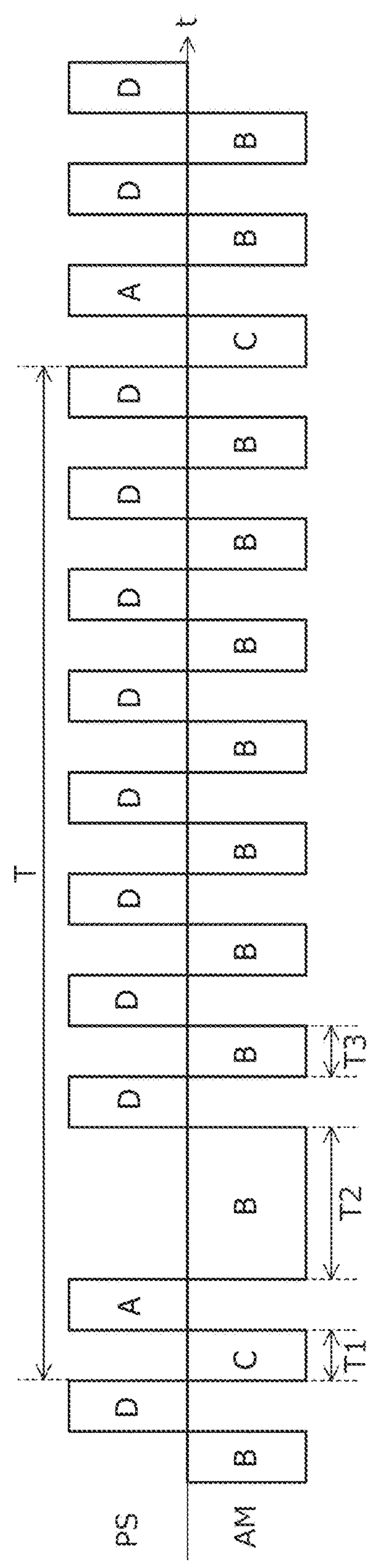
FIG. 3 is a diagram illustrating timings of an alternating magnetic field AM and a pen signal PS.

FIG. 3 is a diagram illustrating timings of the alternating magnetic field AM and the pen signal PS. The figure illustrates an example of a case where the sensor controller 31 is performing the local scanning. As illustrated in the figure, the sensor controller 31 is configured to send out a command CMD in a cycle T. The alternating magnetic field AM for transmitting the command CMD is modulated by the command CMD, and is sent out over predetermined time T1.

The command CMD is used to inquire about a kind of the electromagnetic induction pen 2, for example. The electromagnetic induction pen 2 can be not only of a type having the configuration illustrated in FIG. 2 (which type will hereinafter be referred to as a "professional model") but also of a type in which a variable capacitance capacitor for detecting the pen pressure value is incorporated in the resonance circuit and a change in the capacitance of the variable capacitance capacitor is directly reflected in a change in resonance frequency (which type will hereinafter be referred to as an "entry model"). Receiving the command CMD inquiring about the kind of the electromagnetic induction pen 2, the electromagnetic induction pen 2 transmits an acknowledgment signal ACK indicating of which type the electromagnetic induction pen 2 itself is, by the pen signal PS as a reflection signal. The timing chart illustrated in FIG. 3 represents an example of a case where the electromagnetic induction pen 2 is the professional model.

Recognizing on the basis of the acknowledgment signal ACK that the electromagnetic induction pen 2 is the professional model, the sensor controller 31 sends out a burst Burst as an unmodulated alternating magnetic field AM over predetermined time T2, which is longer than the predetermined time T1. During a period during which an alternating current generated by the alternating magnetic field AM is supplied to the processing circuit 24 of the electromagnetic induction pen 2 from the resonance circuit 23, the processing circuit 24 generates information to be transmitted to the sensor controller 31, while operating on power generated by the alternating current. Specifically, the pen pressure value is obtained from the pressure sensor 21, the on/off information is obtained from the side switch 22, and the information to be transmitted is constructed by use of these pieces of obtained data. The processing circuit 24 monitors the amplitude of the alternating current supplied from the resonance circuit 23. When the processing circuit 24 detects on the basis of a decrease in the amplitude that the position detecting device 3 has stopped sending out the alternating magnetic field AM, the processing circuit 24 makes the resonance circuit 23 transmit, by the pen signal PS, data DATA including first four bits of the generated information.

The sensor controller 31 thereafter sends out the alternating magnetic field AM as a burst Burst seven times. This sending out is performed at predetermined intervals, and the sending out of each burst Burst is continued over predetermined time T3. The predetermined time T3 is a period of time shorter than the predetermined time T2, and may be the same as the predetermined time T1 or may be different from the predetermined time T1. Each time the supply of the alternating current generated by the alternating magnetic field AM is newly started, the processing circuit 24 of the electromagnetic induction pen 2 obtains data DATA of four bits from an untransmitted part of the information to be transmitted, and makes the resonance circuit 23 transmit the data DATA by the pen signal PS. The processing circuit 24 can thereby transmit data of a maximum of 32 bits during the cycle T.

The description returns to FIG. 2. Supplied with the position and the information from the sensor controller 31, the host processor 32 performs, by using these, such processing as movement of a cursor displayed on the display surface and generation of stroke data indicating the trajectory of the electromagnetic induction pen 2 within the touch surface. Here, with regard to the stroke data, the host processor 32 also performs processing of rendering and displaying the generated stroke data, processing of generating and recording digital ink including the generated stroke data, processing of transmitting the generated digital ink to an external device according to an instruction of a user, and the like.

A configuration and operation for temporarily changing the capacitance of the capacitor C within the resonance circuit 23 from the first capacitance to the second capacitance will next be described in detail with reference to FIGS. 4 to 7.

Figure 4:
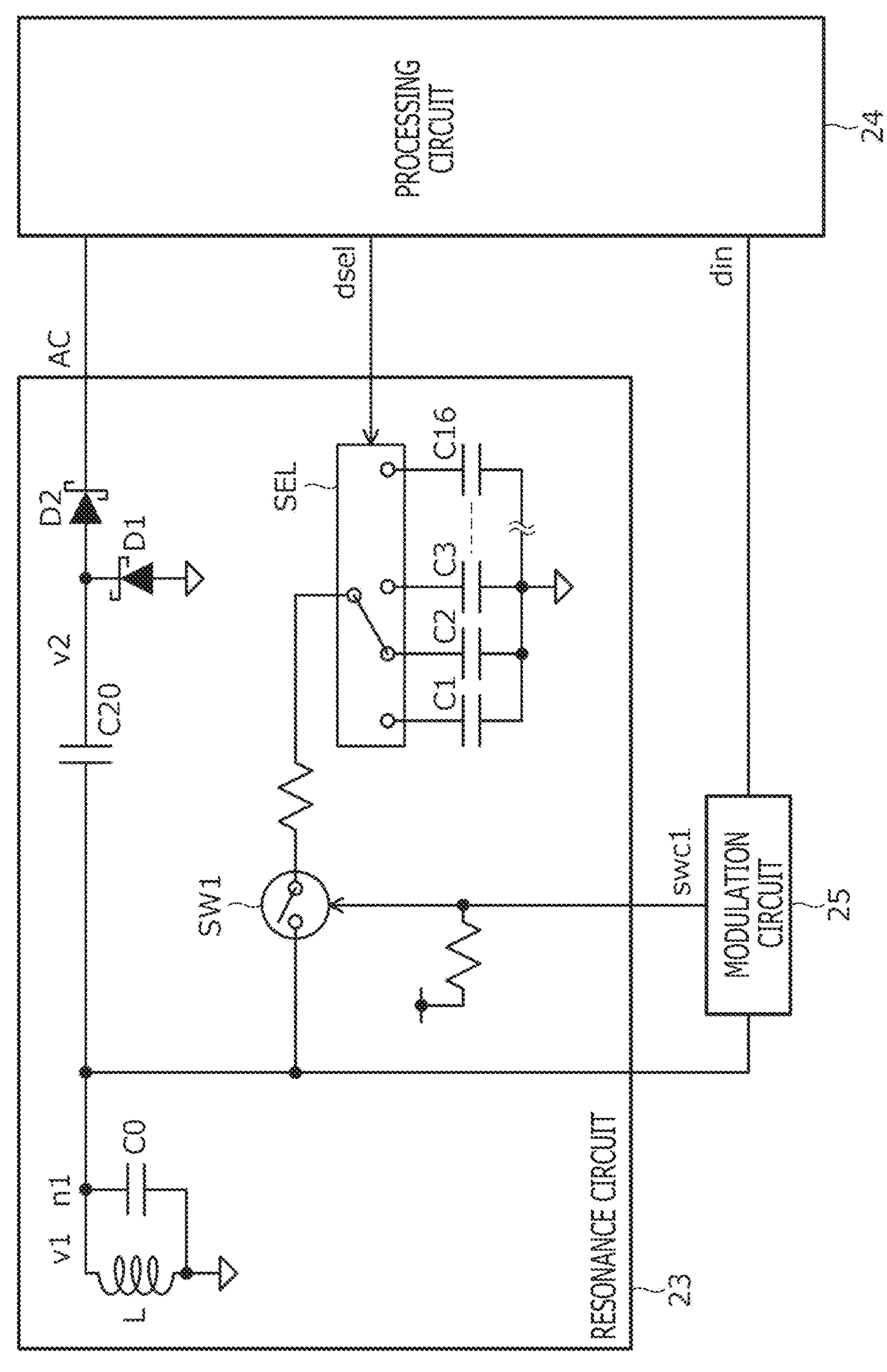
FIG. 4 is a diagram illustrating an internal configuration of a resonance circuit 23 illustrated in FIG. 2.

FIG. 4 is a diagram illustrating an internal configuration of the resonance circuit 23 according to the present embodiment. As illustrated in the figure, the resonance circuit 23 includes a coil L, capacitors C0 to C16 and C20, diodes D1 and D2, a switch element SW1, and a selector SEL.

The coil L is the same as the coil L illustrated in FIG. 2. The coil L is connected between a node n1 and a grounding terminal illustrated in the figure. The capacitor C0 is a capacitor constituting the whole or a part of the capacitor C illustrated in FIG. 2. The capacitor C0 is connected between the node n1 and the grounding terminal. An LC resonance circuit of the coil L and the capacitor C0 is formed by these connections.

The capacitor C20 is a decoupling capacitor that converts an alternating current v1 (voltage signal oscillating about 0 V) appearing at the node n1 into an alternating current v2 oscillating in a positive range, by adding a direct-current voltage to the alternating current v1. The capacitor C20 is inserted at a midpoint of wiring that connects the node n1 and the processing circuit 24 to each other.

The diode D1 is a Schottky barrier diode that has a role of preventing a surge current from flowing into the processing circuit 24. A cathode of the diode D1 is connected to an electrode on the processing circuit 24 side of the capacitor C20. An anode of the diode D1 is grounded. The diode D2 is a Schottky barrier diode that has a role of rectifying a current flowing into the processing circuit 24. A anode of the diode D2 is connected to the electrode on the processing circuit 24 side of the capacitor C20. An cathode of the diode D2 is connected to an input terminal of the processing circuit 24. The current that has passed through the diode D2 is supplied as an alternating current AC to the processing circuit 24.

The switch element SW1 is a single-pole single-throw analog switch that is turned on and off by a control signal swc1 supplied from the modulation circuit 25. One terminal of the switch element SW1 is connected to the node n1. Another terminal of the switch element SW1 is connected to a common terminal of the selector SEL.

The selector SEL is a 1-circuit multiple-contact (specifically, 1-circuit 16-contact) switching circuit that is switching-controlled by a selection signal dsel supplied from the processing circuit 24. One electrode of each of the capacitors C1 to C16 is connected to corresponding one of selection terminals of the selector SEL. The capacitors C1 to C16 are capacitors having capacitances different from each other. Other electrodes of the respective capacitors C1 to C16 are connected in common to the grounding terminal.

A capacitor Cx (x is any of 1 to 16) selected by the selector SEL is connected in parallel with the capacitor C0 and forms the capacitor C illustrated in FIG. 2 together with the capacitor C0 when the switch element SW1 is on. The second capacitance described above is the capacitance of the thus formed capacitor C, and is specifically a combined capacitance of the capacitor C0 and the capacitor Cx. When the switch element SW1 is off, on the other hand, the capacitor Cx is disconnected from the capacitor C0, and the capacitor C illustrated in FIG. 2 is formed by only the capacitor C0. The first capacitance described above is the capacitance of the thus formed capacitor C, and is specifically the capacitance of the capacitor C0 alone.

Here, the processing circuit 24 stores, in advance, a table that associates information of four bits and each of the capacitors C1 to C16 with each other. Further, each time data DATA illustrated in FIG. 3 is to be transmitted, the processing circuit 24 determines the capacitor Cx corresponding to the data DATA to be transmitted, by referring to the above-described table, and supplies, to the selector SEL, the selection signal dsel for causing the determined capacitor Cx to be selected. As a result, the selector SEL is set in a state of selecting the capacitor Cx corresponding to the data DATA to be transmitted. The second capacitance corresponding to the data DATA to be transmitted is thereby realized.

The modulation circuit 25 performs processing of temporarily changing the capacitance of the capacitor C from the first capacitance to the second capacitance by controlling the on/off state of the switch element SW1 by using the control signal swc1. More specifically, the modulation circuit 25 is configured to change the capacitance of the capacitor C from the first capacitance to the second capacitance by turning on the switch element SW1 and change the capacitance of the capacitor C from the second capacitance to the first capacitance by turning off the switch element SW1. Timings at which the modulation circuit 25 turns on and off the switch element SW1 are controlled by the alternating current v1 described above and a control signal din supplied from the processing circuit 24.

The control signal din is a signal indicating that the sending out of the alternating magnetic field AM is ended. The processing circuit 24 is configured to activate the control signal din over predetermined time when the processing circuit 24 detects that the sending out of the alternating magnetic field AM by the position detecting device 3 is ended by detecting a decrease in amplitude of the alternating current AC. The modulation circuit 25 controls the switch element SW1 to an on state at a timing of a rising edge of the alternating current v1 while the control signal din is activated. After the control signal din is returned to a deactivated state, the modulation circuit 25 returns the switch element SW1 to an off state at a timing at which the alternating current v1 rises again.

Until the modulation circuit 25 controls the switch element SW1 to an on state, the resonance frequency of the resonance circuit 23 is a value corresponding to the first capacitance (first frequency described above). When the modulation circuit 25 that detects a rising edge of the alternating current v1 while the control signal din is activated controls the switch element SW1 to an on state, the capacitance of the capacitor C becomes the second capacitance, and therefore, the resonance frequency of the resonance circuit 23 changes to a value corresponding to the second capacitance (second frequency described above). Here, since the second capacitance is a combined capacitance of the capacitor C0 and the capacitor Cx as described above, a specific value of the resonance frequency of the resonance circuit 23 after the change is different according to the capacitance of the capacitor Cx. Hence, a timing at which the switch element SW1 returns to an off state is also different according to the capacitance of the capacitor Cx. The electromagnetic induction pen 2 according to the present embodiment can therefore control the phase of the alternating current v1 whose frequency has been returned to the first frequency, by information of four bits as a transmission target. In addition, the frequency of the resonance circuit 23 is changed from the first frequency to the second frequency during a very short period of time, and the frequency of the resonance circuit 23 is returned to the first frequency after the switch element SW1 is turned off. A decrease in the reception level in the quadrature detection performed by the position detecting device 3 therefore hardly occurs. Hence, the electromagnetic induction pen according to the present embodiment can achieve a multi-level pen signal PS (specifically, four-bit phase modulation) without causing a decrease in the reception level in the quadrature detection of the position detecting device 3.

Incidentally, the modulation circuit 25 temporarily changes the capacitance of the capacitor C after the activation of the control signal din, because the frequency of the alternating current v1 is determined by the frequency of the alternating magnetic field AM even when the resonance frequency of the resonance circuit 23 is changed by a change in the capacitance of the capacitor C under conditions where an electromotive force is generated by the alternating magnetic field AM. By changing the capacitance of the capacitor C after the sending out of the alternating magnetic field AM is ended, it is possible to control the frequency of the alternating current v1 to a value corresponding to the second capacitance.

Figure 5:
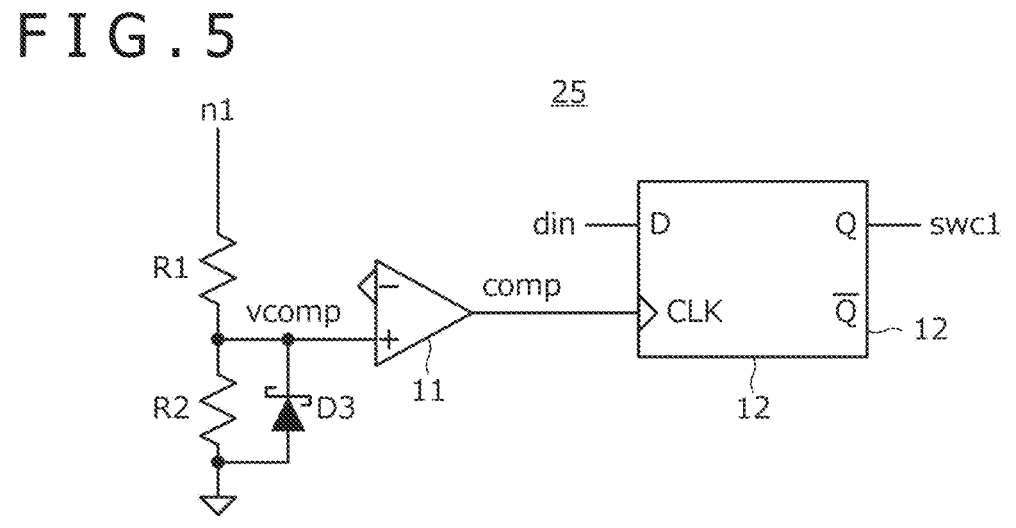

FIG. 5 is a diagram illustrating a specific example of a configuration of the modulation circuit 25. As illustrated in the figure, the modulation circuit 25 according to the present example includes a comparator 11, a D-type flip-flop circuit 12, resistances R1 and R2, and a diode D3.

The resistances R1 and R2 are installed for voltage-dividing the alternating current v1. The resistances R1 and R2 are connected in series with each other in this order between the node n1 and the grounding terminal. A contact between the resistance R1 and the resistance R2 is connected to a non-inverting input terminal of the comparator 11. The diode D3 is a Schottky barrier diode connected in parallel with the resistance R2. The diode D3 plays a role of preventing a surge current from flowing into the comparator 11.

The comparator 11 is a circuit that compares an alternating current vcomp generated by voltage-dividing the alternating current v1 by the resistances R1 and R2 with a ground potential supplied to an inverting input terminal of the comparator 11, and outputs a voltage signal comp corresponding to a result of the comparison. Specifically, the comparator 11 is configured to set the voltage signal comp high when the alternating current vcomp is larger than the ground potential and set the voltage signal comp low when the alternating current vcomp is smaller than the ground potential.

The D-type flip-flop circuit 12 is a circuit that has a clock terminal CLK, a data terminal D, an output terminal Q, and an inverting output terminal Q bar, latches the value of the data terminal D at a rising edge of the clock terminal CLK, and outputs the value from the output terminal Q. An output signal from the inverting output terminal Q bar, which is a signal obtained by inverting an output signal from the output terminal Q, is not used in the present embodiment. The clock terminal CLK is supplied with the voltage signal comp from the comparator 11. The data terminal D is supplied with the control signal din, which is a low-active pulse signal, from the processing circuit 24. The output of the output terminal Q is supplied as the control signal swe1 to the switch element SW1. The control signal swe1 according to the example of FIG. 5 is a low-active signal that sets the switch element SW1 in an off state when the signal is high and that sets the switch element SW1 in an on state when the signal is low.

When the processing circuit 24 determines that the sending out of the alternating magnetic field AM is ended, the processing circuit 24 activates the control signal din (sets the control signal din low) over a period slightly shorter than one cycle of the first frequency. When the voltage signal comp changes from low to high while the control signal din is activated, the control signal swc1 is activated (set low) by the control of the D-type flip-flop circuit 12, and thus, the switch element SW1 is set in an on state. Hence, after the sending out of the alternating magnetic field AM is ended, the capacitance of the capacitor C changes from the first capacitance to the second capacitance at a timing at which the alternating current v1 changes from negative to positive.

Thereafter, when the control signal din returns to a deactivated state and, next, the voltage signal comp changes from low to high again, the control signal swe1 is returned to a deactivated state (set high) by the control of the D-type flip-flop circuit 12, and thus, the switch element SW1 is set in an off state. Hence, after the switch element SW1 is turned on, the capacitance of the capacitor C returns from the second capacitance to the first capacitance at a timing at which the alternating current v1 changes from negative to positive again.

As described above, according to the configuration example illustrated in FIG. 5, the above-described operation of the modulation circuit 25 can be realized. In addition, because a rising edge of the voltage signal comp and a timing at which the alternating current v1 becomes 0 coincide with each other, the switch element SW1 can be turned on and off when no power (charge) is stored in the capacitor Cx. Hence, it is possible to prevent a decrease in the level of the alternating current AC due to the turning on and off of the switch element SW1.

Figure 6:
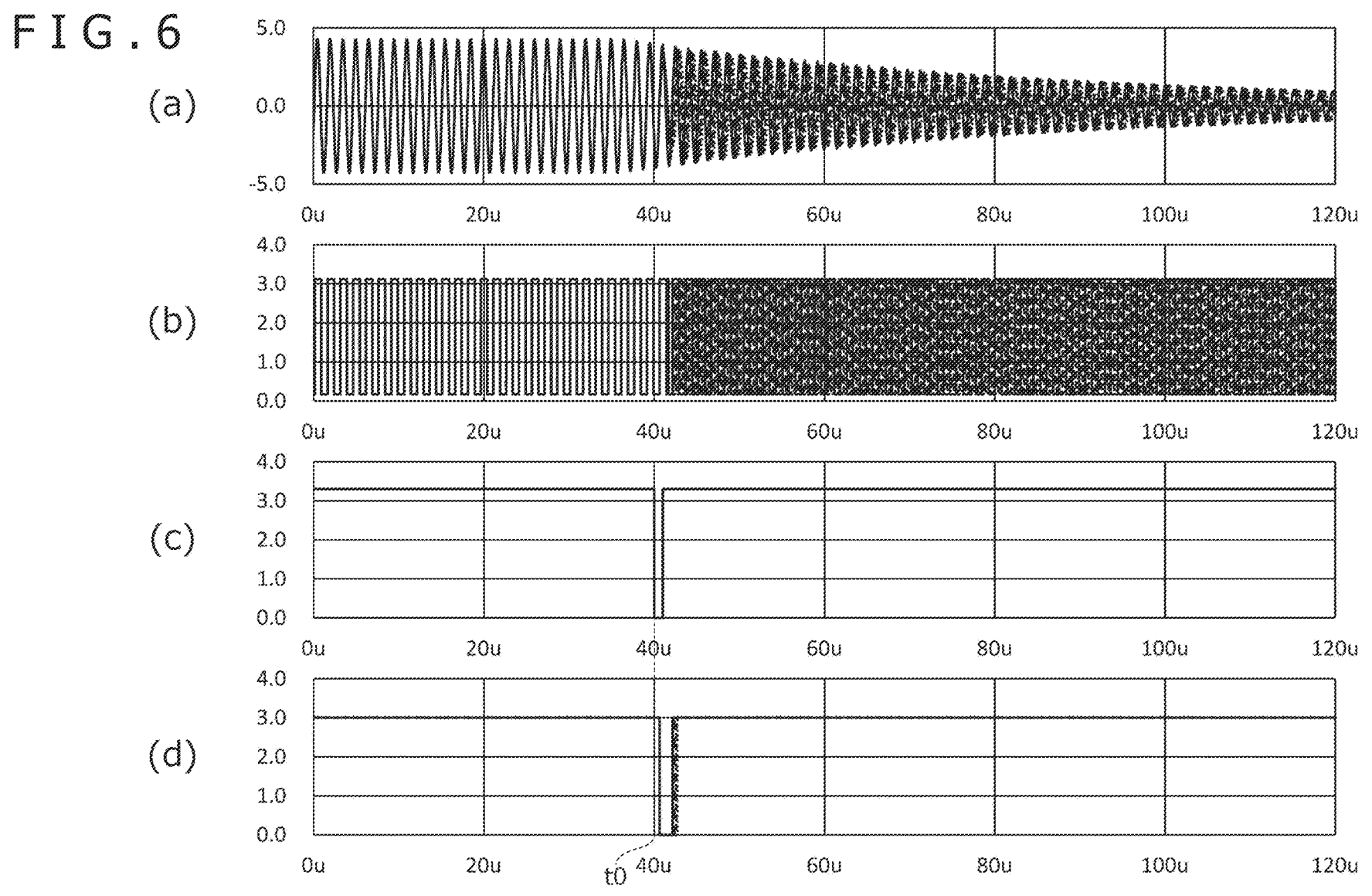
Figure 7:
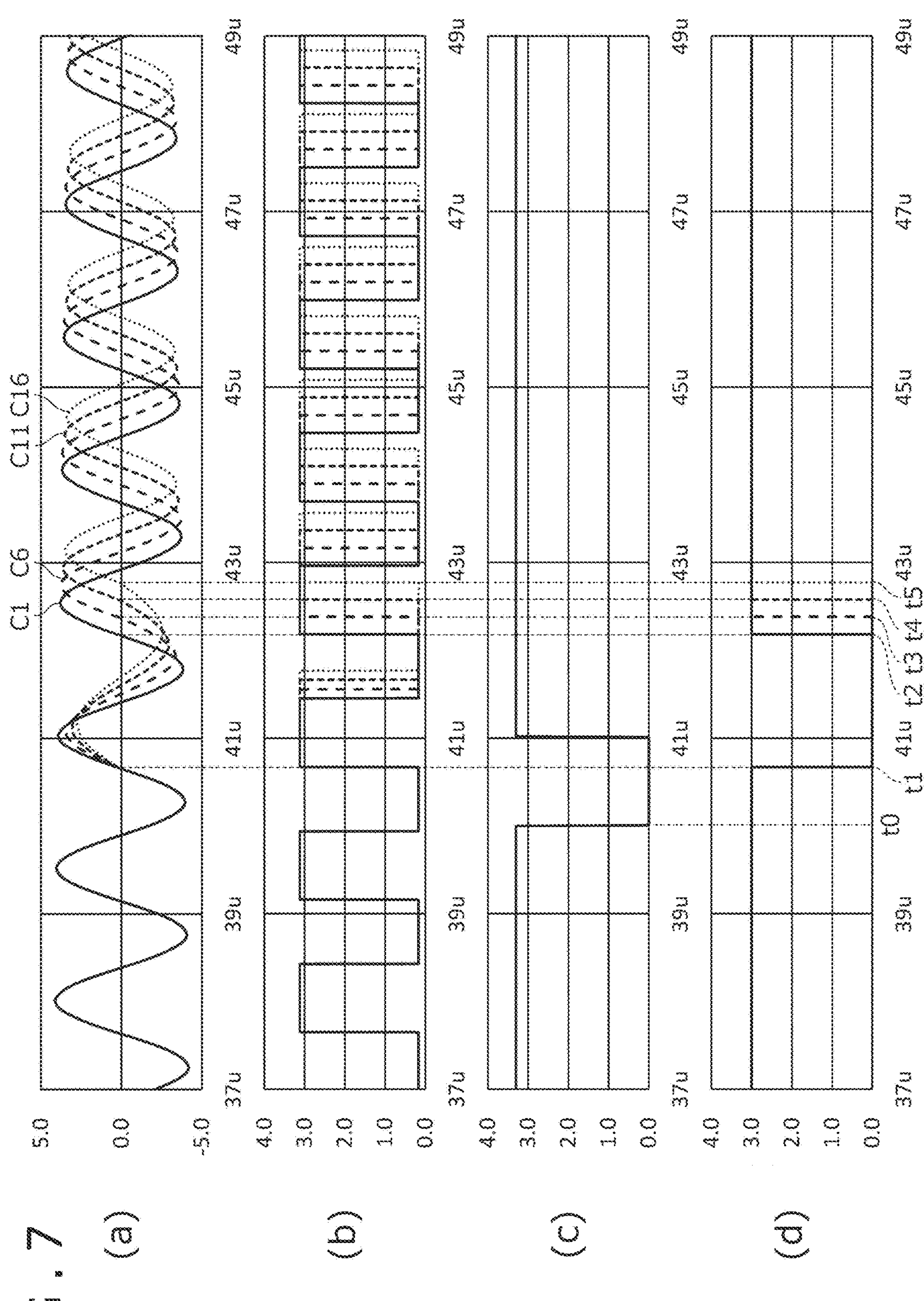
FIG. 7 is a diagram illustrating simulation waveforms of the alternating current v1, the voltage signal comp, the control signal din, and the control signal swc1 according to the first embodiment of the present disclosure.

FIG. 6 and FIG. 7 are diagrams illustrating simulation waveforms of the alternating current v1 (shown in (a), the voltage signal comp (shown in (b), the control signal din (shown in (c), and the control signal swc1 (shown in (d). An axis of abscissas in each of the diagrams indicates time, and an axis of ordinates therein indicates voltages. The axis of abscissas is in microseconds (displayed as "u" in the figures) . The same is true also for other simulation waveforms to be illustrated later. At a time point at a left end of FIG. 6 (0 microseconds), the position detecting device 3 is sending out the alternating magnetic field AM. In addition, at a time point at a right end of FIG. 6 (120 microseconds), the electromagnetic induction pen 2 is transmitting the pen signal PS as a reflection signal. FIG. 7 is an enlargement of the waveforms illustrated in FIG. 6 in a period from 37 microseconds to 49 microseconds.

In the simulation of FIG. 6 and FIG. 7, the modulation circuit 25 was configured according to the configuration example illustrated in FIG. 5. In addition, the first frequency was set at 666 kHz (approximately 1.502 microseconds as a cycle), the inductance of the coil L was set at 37.5 μH, the capacitance of the capacitor C0 was set at 1519.8 pF, the capacitance of the capacitor C20 was set at 0.01 pF, the resistance value of the resistance R1 was set at 82 kΩ, and the resistance value of the resistance R2 was set at 1 kΩ. The capacitances of the capacitors C1 to C16 were respectively set at 1 pF, 82 pF, 167 pF, 253 pF, 342 pF, 432 pF, 525 pF, 620 pF, 718 pF, 817 pF, 919 pF, 1022 pF, 1128 pF, 1236 pF, 1347 pF, and 1459 pF. As is understood from the following FIG. 8, these values were selected such that phase change widths were uniform.

However, FIG. 6 and FIG. 7 illustrate only four waveforms corresponding to cases where the capacitors C1 (=1 pF), C6 (=432 pF), C11 (=919 pF), and C16 (=1459 pF) are selected by the selector SEL. In actuality, needless to say, waveforms corresponding to the respective capacitors C2, C3, C4, C5, C7, C8, C9, C10, C12, C13, C14, and C15 exist, but are omitted in FIG. 6 and FIG. 7 because the drawings become difficult to view when all of the waveforms are included.

Described first with reference to FIG. 6, the control signal din is activated to be low at time t0 (≈40 μs) at which the amplitude of the alternating current v1 starts to decrease. This is because the processing circuit 24 detects that the amplitude of the alternating current AC has started to decrease.

Described next with reference to FIG. 7, when the voltage signal comp changes from low to high (time t1) while the control signal din is activated to be low, the control signal swe1 is activated to be low by the control of the D-type flip-flop circuit 12 at a timing at which the voltage signal comp becomes high. Thus, the switch element SW1 is turned on, and the capacitance of the capacitor C changes from the first capacitance to the second capacitance. However, the second capacitance to which the capacitance of the capacitor C changes is a value different according to the capacitor Cx selected by the selector SEL. As a result, as illustrated in FIG. 7, the frequency of the alternating current v1 (second frequency) is a value different according to the capacitor Cx.

Thereafter, when the control signal din returns to high and the voltage signal comp changes from low to high again (time t2 to time t5), the control signal swe1 is returned to a deactivated state by the control of the D-type flip-flop circuit 12 at a timing at which the voltage signal comp becomes high. The frequency of the alternating current v1 is thereby returned to the first frequency. Here, since a specific value of the frequency of the alternating current v1 (second frequency) obtained during an on state of the switch element SW1 is different according to the capacitor Cx, a timing at which the frequency of the alternating current v1 is returned to the first frequency is also different according to the capacitor Cx. As a result, as illustrated in FIG. 7, the phase of the alternating current v1 after returning to oscillation at the first frequency is changed by an amount corresponding to the capacitance of the capacitor Cx as compared with the phase of the alternating current v1 obtained before the switch element SW1 is turned on. Hence, it can be said that, in the simulation of FIG. 6 and FIG. 7, the changing, by an amount corresponding to the information as the transmission target, of the phase of the pen signal PS transmitted at the first frequency is achieved.

Figure 8:
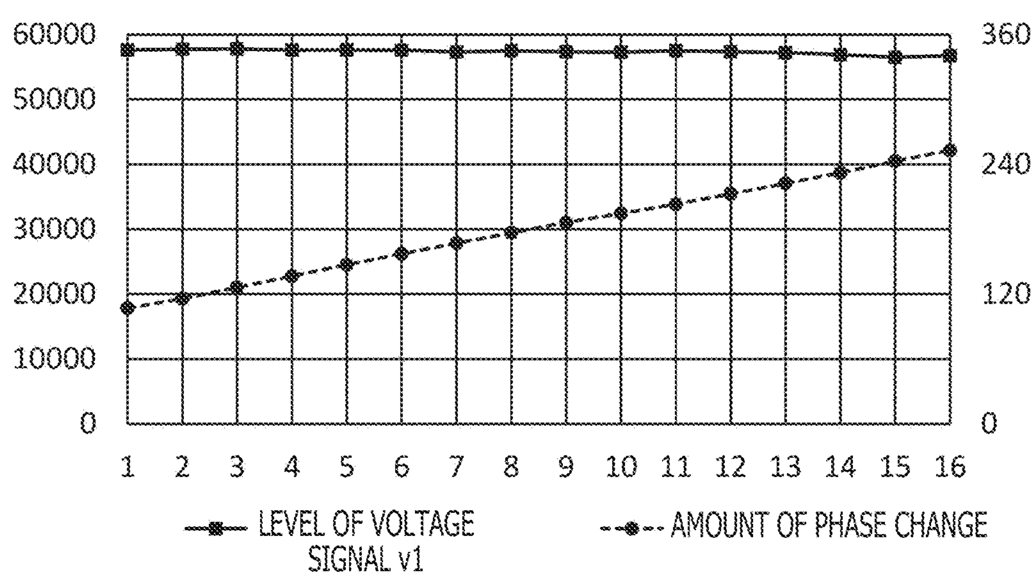
FIG. 8 is a plot of the level of the alternating current v1 and an amount of change in the phase of the alternating current v1 for each capacitor Cx selected by a selector SEL.

FIG. 8 is a plot of the level of the alternating current v1 and an amount of change in the phase of the alternating current v1 for each capacitor Cx selected by the selector SEL. Numbers 1 to 16 illustrated on the axis of abscissas in the figure correspond to x of the capacitor Cx. In addition, the level of the alternating current v1 represents the level obtained immediately after the capacitance of the capacitor C is returned from the second capacitance to the first capacitance.

It is understood from the result of FIG. 8 that, by performing the processing of temporarily changing the capacitance of the capacitor C from the first capacitance to the second capacitance, the electromagnetic induction pen 2 according to the present embodiment achieves the changing of the phase by a maximum of approximately 150° almost without decreasing the level of the alternating current v1.

As described above, the electromagnetic induction pen 2 according to the present embodiment can control the phase of the pen signal PS transmitted at the first frequency, on the basis of the information as the transmission target, and can therefore achieve a multilevel pen signal PS without causing a decrease in the reception level in the quadrature detection of the position detecting device 3.

Incidentally, while the foregoing embodiment achieves four-bit phase modulation by using the 16 capacitors C1 to C16, the number of capacitors C connected to the selector SEL may be reduced to 15 by using a case where the capacitance of the capacitor C is not temporarily changed from the first capacitance to the second capacitance. In addition, multilevel phase modulation other than the four-bit phase modulation, such as two-bit phase modulation and eight-bit phase modulation, may be performed by adjusting, as appropriate, the number of capacitors selected by the selector SEL.

As with FIG. 8, FIGS. 9A to 9C are respectively plots of the level of the alternating current v1 and an amount of change in the phase of the alternating current v1 for electromagnetic induction pens 2 according to first to third modifications of the present embodiment.

Figure 9A:
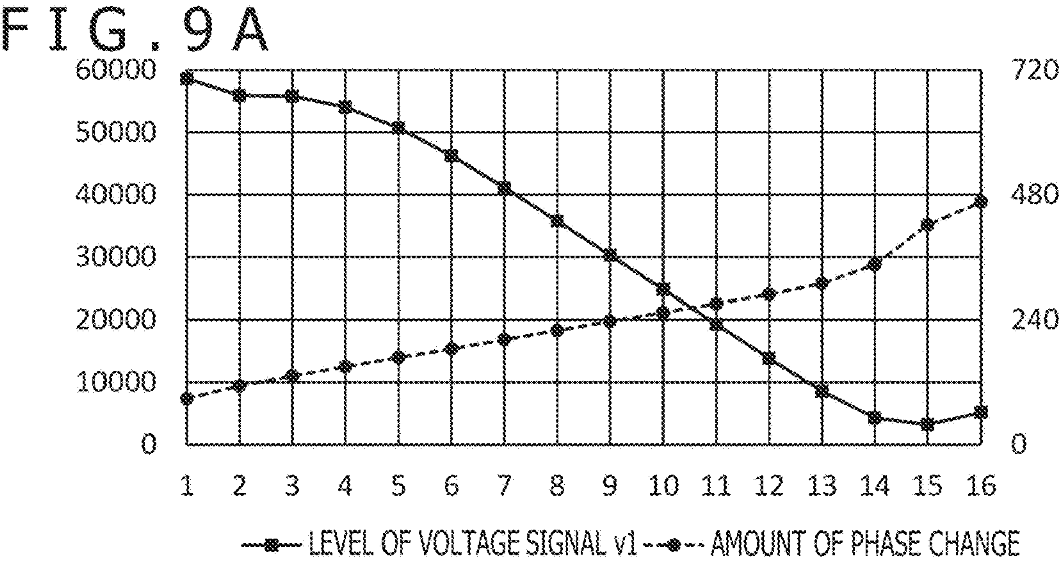
FIGS. 9A to 9C are respectively plots of the level of the alternating current v1 and an amount of change in the phase of the alternating current v1, as with FIG. 8, for electromagnetic induction pens 2 according to first to third modifications of the first embodiment of the present disclosure.

The first modification illustrated in FIG. 9A represents an example of a case where the selector SEL is not provided, only one capacitor having a capacitance of 200 pF is provided in a stage subsequent to the switch element SW1, and the phase of the alternating current v1 is controlled by the length of time during which the switch element SW1 is set in an on state. However, as in the present embodiment, a timing at which the switch element SW1 is turned on is set to be a timing at which the voltage signal comp changes to high. In addition, numbers 1 to 16 illustrated on the axis of abscissas in the figure respectively correspond to cases where the length of the time during which the switch element SW1 is set in an on state is 0.0 μs, 1.5 μs, 3.0 μs, 4.5 μs, 6.0 μs, 7.5 μs, 9.0 μs, 10.5 μs, 12.0 μs, 13.5 μs, 15.0 μs, 16.5 μs, 18.0 μs, 19.5 μs, 21.0 μs, and 22.5 μs.

As illustrated in FIG. 9A, in the first modification, whereas a phase change exceeding 360° can be achieved, the level of the alternating current v1 is greatly decreased when the time during which the switch element SW1 is set in an on state is lengthened. Hence, the electromagnetic induction pen according to the first modification needs to be used in a range in which a decrease in the level of the alternating current v1 is small.

Figure 9B:
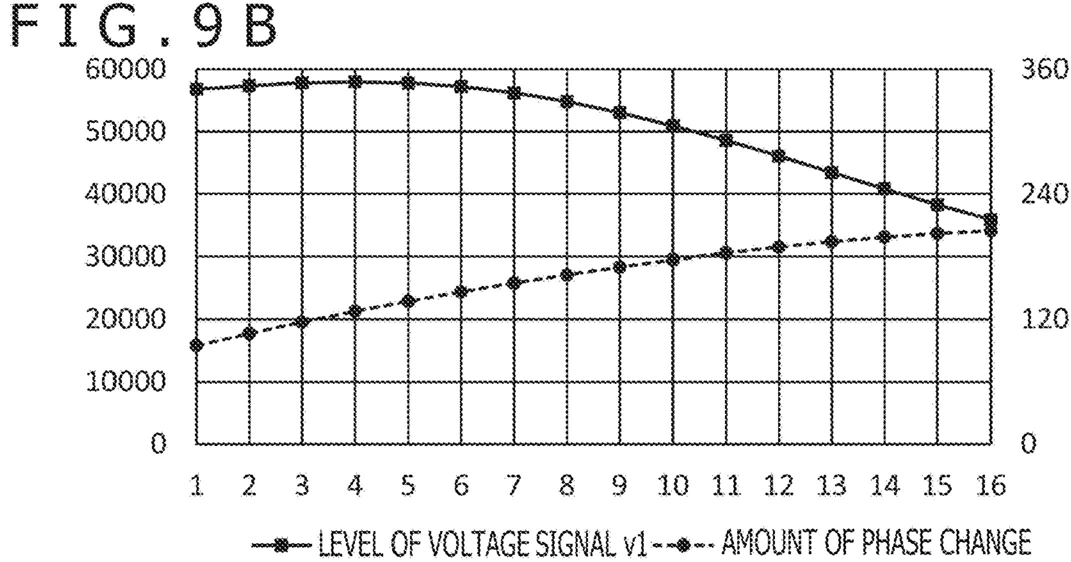

The second modification illustrated in FIG. 9B represents an example of a case where the phase of the alternating current v1 is controlled under the same conditions as in FIG. 9A except that the capacitance of the capacitor provided in the stage subsequent to the switch element SW1 is set at 100 pF. In the second modification, a decrease in the level of the alternating current v1 is suppressed as compared with the first modification, though not to the same degree as in the present embodiment. The second modification is therefore considered to be able to achieve phase modulation for more values than those in the first modification.

The third modification illustrated in FIG. 9(*c*) represents an example of a case where the phase of the alternating current v1 is controlled by a configuration similar to that of the present embodiment except that, unlike the present embodiment, the length of a period taken until the switch element SW1 is turned off is fixed at 1.5 μs while, as in the present embodiment, the switch element SW1 is turned on at a timing at which the voltage signal comp becomes high. However, the capacitances of the capacitors C1 to C16 were respectively set at 0 pF, 100 pF, 200 pF, 300 pF, 400 pF, 500 pF, 600 pF, 700 pF, 800 pF, 900 pF, 1000 pF, 1100 pF, 1200 pF, 1300 pF, 1400 pF, and 1500 pF.

Figure 9C:
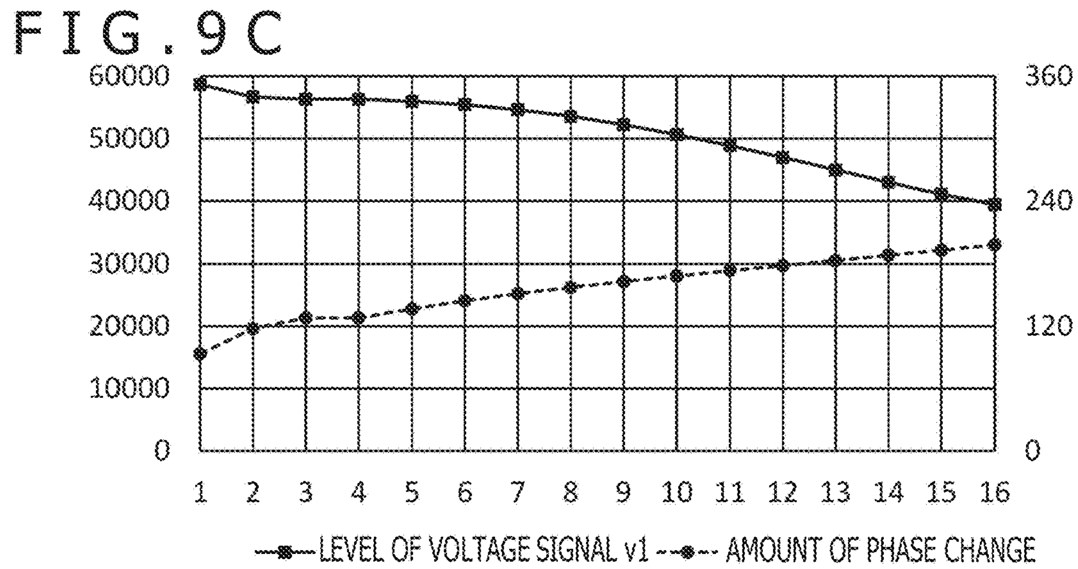

In the third modification, as illustrated in FIG. 9C, a result substantially similar to that of the second modification was obtained. Hence, the third modification is also considered to be able to achieve phase modulation for more values than those in the first modification.

A position detection system 1 according to the second embodiment of the present disclosure will next be described. The position detection system 1 according to the present embodiment is similar to the position detection system 1 according to the first embodiment except that the internal configuration of the resonance circuit 23 and the operation of the modulation circuit 25 in the position detection system 1 according to the present embodiment are different from those of the position detection system 1 according to the first embodiment. Accordingly, in the following, description will be made by directing attention to differences from the position detection system 1 according to the first embodiment.

Figure 10:
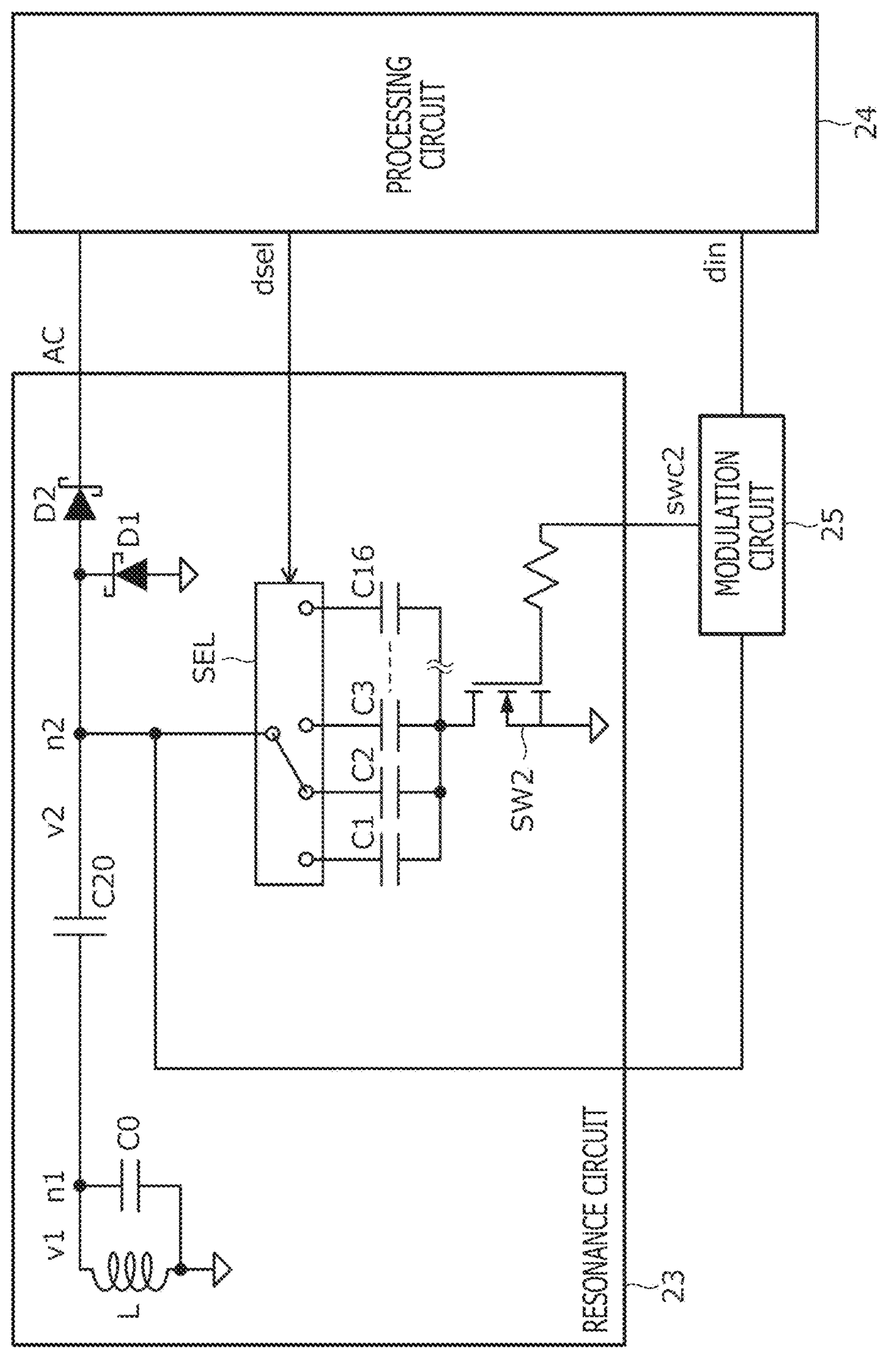
FIG. 10 is a diagram illustrating an internal configuration of a resonance circuit 23 according to a second embodiment of the present disclosure.

FIG. 10 is a diagram illustrating an internal configuration of the resonance circuit 23 according to the present embodiment. As is understood by comparing FIG. 10 with FIG. 4, the resonance circuit 23 according to the present embodiment is different from the resonance circuit 23 according to the first embodiment in that the resonance circuit 23 according to the present embodiment includes a switch element SW2 in place of the switch element SW1 and in that the common terminal of the selector SEL and the modulation circuit 25 are connected to the electrode on the processing circuit 24 side of the capacitor C20 (which electrode will hereinafter be referred to as a "node n2") in place of the node n1.

The switch element SW2 is an N-channel metal-oxide-semiconductor field-effect transistor (MOSFET). A drain of the switch element SW2 is connected in common to the other electrodes of the capacitors C1 to C16. A source of the switch element SW2 is connected to the grounding terminal. In addition, a gate of the switch element SW2 is supplied with a control signal swc2 from the modulation circuit 25. The common terminal of the selector SEL is directly connected to the node n2 without the intervention of the switch element SW1 illustrated in FIG. 4.

The modulation circuit 25 according to the present embodiment performs the processing of temporarily changing the capacitance of the capacitor C illustrated in FIG. 2 from the first capacitance to the second capacitance by controlling the on/off state of the switch element SW2 by using the control signal swc2. In the present embodiment, the first capacitance is the capacitance of the capacitor C0 alone, and the second capacitance is a combined capacitance of the capacitors C0, C20, and Cx. More specifically, the modulation circuit 25 is configured to change the capacitance of the capacitor C from the first capacitance to the second capacitance by turning on the switch element SW2 and change the capacitance of the capacitor C from the second capacitance to the first capacitance by turning off the switch element SW2. Timings at which the modulation circuit 25 turns on and off the switch element SW2 are controlled by the alternating current v2 appearing at the node n2 and the control signal din supplied from the processing circuit 24.

Specifically, the modulation circuit 25 controls the switch element SW2 to an on state at a timing of a rising edge of the alternating current v2 while the control signal din is activated, and the modulation circuit 25 returns the switch element SW2 to an off state at a timing at which the alternating current v2 rises again after the control signal din returns to a deactivated state. According to such operation of the modulation circuit 25, as in the first embodiment, the resonance frequency of the resonance circuit 23 is temporarily changed from the first frequency to the frequency corresponding to the capacitance of the capacitor Cx (second frequency). The phase of the alternating current v1 whose frequency has been returned to the first frequency can therefore be controlled by information of four bits as a transmission target. In addition, the frequency of the resonance circuit 23 is changed from the first frequency to the second frequency during a very short period of time, and the frequency of the resonance circuit 23 is returned to the first frequency after the switch element SW2 is turned off. A decrease in the reception level in the quadrature detection performed by the position detecting device 3 therefore hardly occurs. Hence, the electromagnetic induction pen according to the present embodiment can also achieve a multilevel pen signal PS (specifically, four-bit phase modulation) without causing a decrease in the reception level in the quadrature detection of the position detecting device 3.

Figure 11:
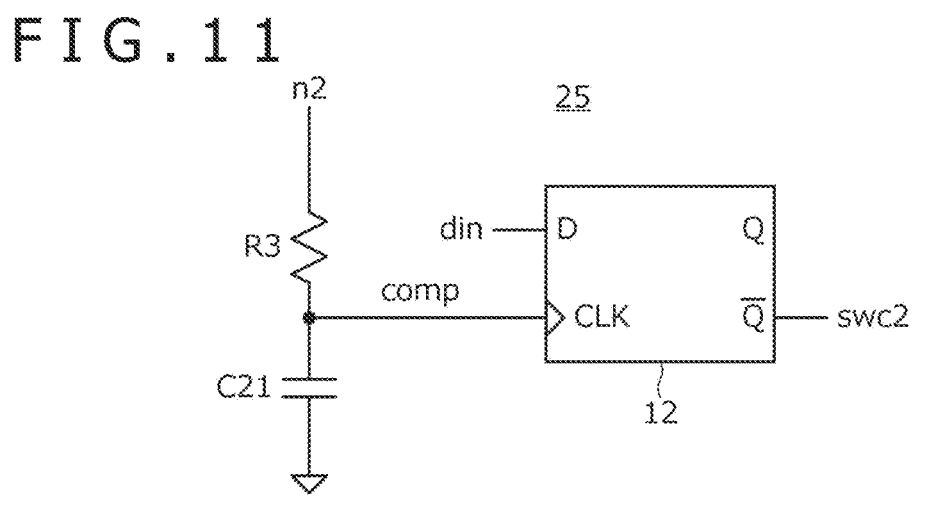

FIG. 11 is a diagram illustrating a specific example of a configuration of the modulation circuit 25 according to the present embodiment. As illustrated in the figure, the modulation circuit 25 according to the present example includes a D-type flip-flop circuit 12, a resistance R3, and a capacitor C21.

The resistance R3 and the capacitor C21 are connected in series with each other in this order between the node n2 and the grounding terminal. A voltage signal comp appearing at a contact between the resistance R1 and the capacitor C21 is connected to the clock terminal CLK of the D-type flip-flop circuit 12. Whereas the voltage signal comp according to the first embodiment is a pulse signal, the voltage signal comp according to the present embodiment is a substantially sinusoidal signal similar to the alternating current v2.

A configuration and operation of the D-type flip-flop circuit 12 are similar to those illustrated in FIG. 4. However, the control signal swc2 is constituted by a high-active signal output from the inverting output terminal Q bar instead of the output terminal Q.

When the voltage signal comp rises while the control signal din is activated to be low by the processing of the processing circuit 24, the control signal swc2 is activated (set high) by the control of the D-type flip-flop circuit 12, and thus, the switch element SW2 is set in an on state. Hence, after the sending out of the alternating magnetic field AM is ended, the capacitance of the capacitor C changes from the first capacitance to the second capacitance at a timing of a rising edge of the alternating current v2.

Thereafter, when the control signal din returns to a deactivated state and, next, the voltage signal comp rises again, the control signal swc2 is returned to a deactivated state (set low) by the control of the D-type flip-flop circuit 12, and thus, the switch element SW2 is set in an off state. Hence, after the switch element SW2 is turned on, the capacitance of the capacitor C returns from the second capacitance to the first capacitance at a timing at which the alternating current v1 rises again.

As described above, according to the configuration example illustrated in FIG. 11, the above-described operation of the modulation circuit 25 can be realized.

Figure 12:
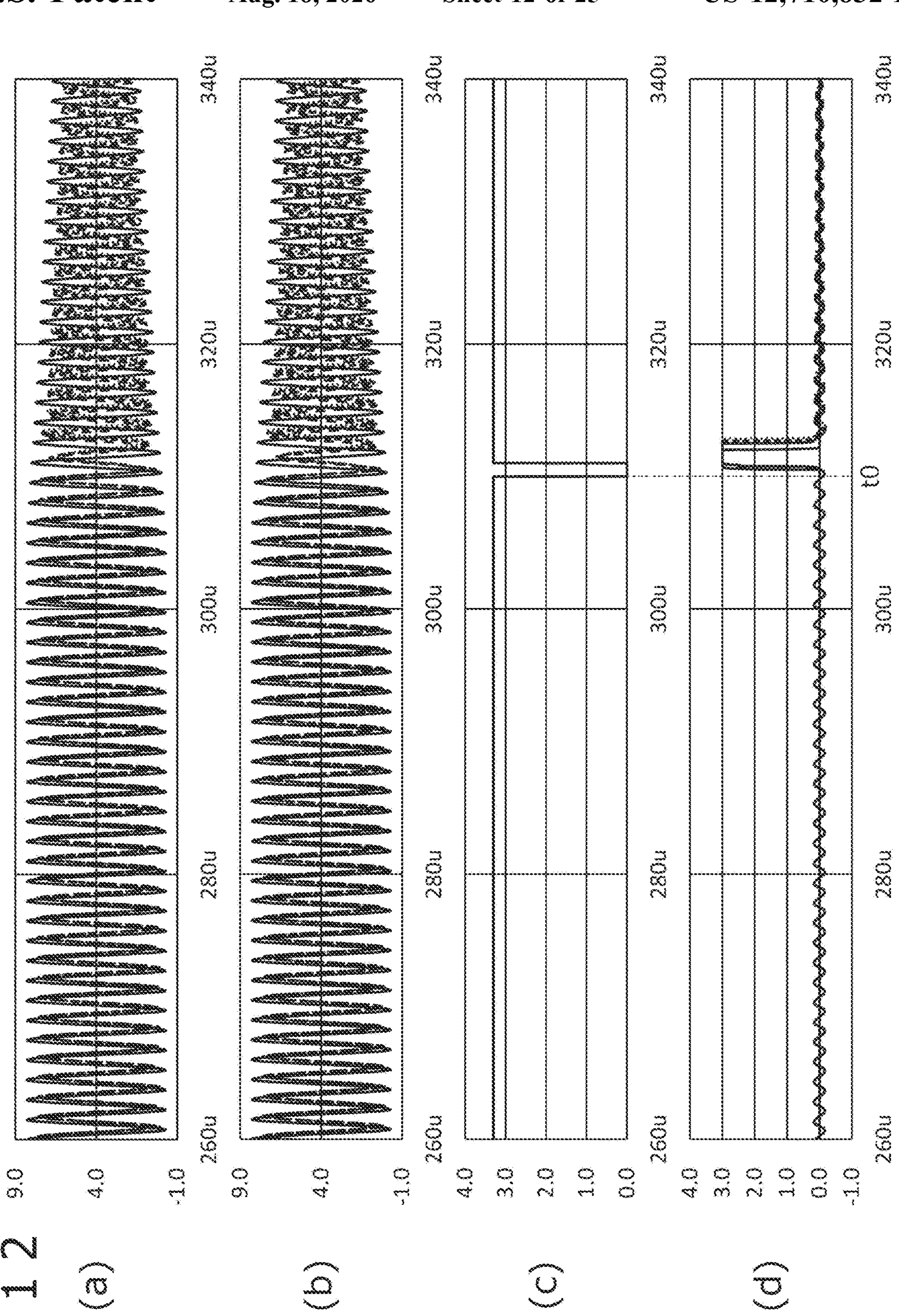
FIG. 12 is a diagram illustrating simulation waveforms of an alternating current v2, a voltage signal comp, a control signal din, and a control signal swc2 according to the second embodiment of the present disclosure.
Figure 13:
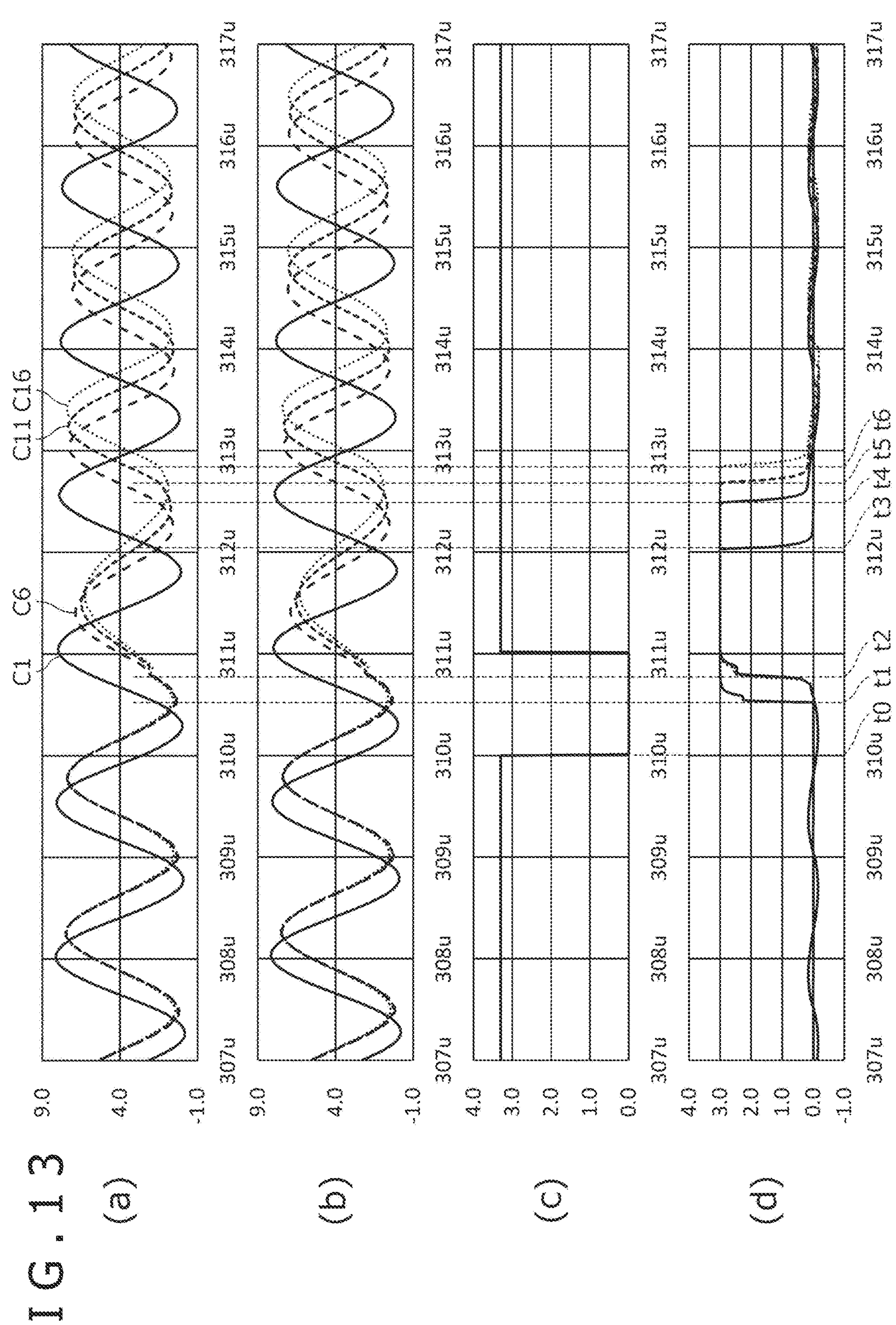
FIG. 13 is a diagram illustrating simulation waveforms of the alternating current v2, the voltage signal comp, the control signal din, and the control signal swc2 according to the second embodiment of the present disclosure.

FIG. 12 and FIG. 13 are diagrams illustrating simulation waveforms of the alternating current v2 (shown in (a), the voltage signal comp (shown in (b), the control signal din (shown in (c), and the control signal swc2 (shown in (d) according to the present embodiment. At a time point at a left end of FIG. 12 (260 microseconds), the position detecting layer 3 is sending out the alternating magnetic field AM. In addition, at a time point at a right end of FIG. 6 (340 microseconds), the electromagnetic induction pen 2 is transmitting the pen signal PS as a reflection signal. FIG. 13 is an enlargement of the waveforms illustrated in FIG. 11 in a period from 307 microseconds to 317 microseconds.

In the simulation of FIG. 12 and FIG. 13, the modulation circuit 25 was configured according to the configuration example illustrated in FIG. 11. In addition, the capacitance of the capacitor C21 was set at 1 pF, and the resistance value of the resistance R3 was set at 10 kΩ. Other circuit constants were set to be the same values as those in the simulation of FIG. 6.

As in FIG. 6 and FIG. 7, FIG. 12 and FIG. 13 illustrate only four waveforms corresponding to cases where the capacitors C1 (=1 pF), C6 (=432 pF), C11 (=919 pF), and C16 (=1459 pF) are selected by the selector SEL. In actuality, needless to say, waveforms corresponding to the respective capacitors C2, C3, C4, C5, C7, C8, C9, C10, C12, C13, C14, and C15 exist, but are omitted in FIG. 12 and FIG. 13 because the drawings become difficult to view when all of the waveforms are included.

Described first with reference to FIG. 12, the control signal din is activated to be low at time t0 (≈310 μs) at which the amplitude of the alternating current v2 starts to decrease. This is because the processing circuit 24 detects that the amplitude of the alternating current AC has started to decrease.

Described next with reference to FIG. 13, when the voltage signal comp rises (time t1 or t2) while the control signal din is activated, the control signal swe2 is activated to be high by the control of the D-type flip-flop circuit 12 at a timing of a rising edge of the voltage signal comp. Thus, the switch element SW2 is turned on, and the capacitance of the capacitor C changes from the first capacitance to the second capacitance. However, as in the first embodiment, the second capacitance to which the capacitance of the capacitor C changes is a value different according to the capacitor Cx selected by the selector SEL. As a result, as illustrated in FIG. 13, the frequency of the alternating current v2 (second frequency) is a value different according to the capacitor Cx.

Here, in the present embodiment, as illustrated in FIG. 13, the waveform is different according to the capacitor Cx selected by the selector SEL even in a stage before the switch element SW2 is turned on. This is because the capacitor Cx selected by the selector SEL is not completely detached from the circuit due to the presence of a parasitic capacitance of the switch element SW2 even when the switch element SW2 is off. Hence, in the present embodiment, the first frequency is also slightly different according to the capacitor Cx selected by the selector SEL.

After the capacitance of the capacitor C changes to the second capacitance, when the control signal din returns to high and the voltage signal comp rises again (time t3 to time t6), the control signal swc2 is returned to a deactivated state by the control of the D-type flip-flop circuit 12 at a timing of a rising edge of the voltage signal comp. The frequency of the alternating current v1 is thereby returned to the first frequency. Here, as in the first embodiment, because a specific value of the frequency of the alternating current v1 (second frequency) obtained during an on state of the switch element SW2 is different according to the capacitor Cx, a timing at which the frequency of the alternating current v1 is returned to the first frequency is also different according to the capacitor Cx. As a result, as illustrated in FIG. 13, the phase of the alternating current v2 after returning to oscillation at the first frequency is changed by an amount corresponding to the capacitance of the capacitor Cx as compared with the phase of the alternating current v2 obtained before the switch element SW1 is turned on. Incidentally, though the alternating current v1 is not illustrated in FIG. 13, the phase of the alternating current v1 also changes in a similar manner to that of the alternating current v2. Hence, it can be said that, also in the simulation of FIG. 12 and FIG. 13, the changing, by an amount corresponding to the information as the transmission target, of the phase of the pen signal PS transmitted at the first frequency is achieved.

As described above, the electromagnetic induction pen 2 according to the present embodiment can also control the phase of the pen signal PS transmitted at the first frequency, on the basis of the information as the transmission target, and can therefore achieve a multilevel pen signal PS without causing a decrease in the reception level in the quadrature detection of the position detecting device 3.

In addition, the electromagnetic induction pen 2 according to the present embodiment inputs the alternating current v2 instead of the alternating current v1 to the common terminal of the selector SEL and the modulation circuit 25. Thus, as compared with the first embodiment, the comparator 11 is rendered unnecessary, and the switch element SW2 as a MOSFET can be used in place of the switch element SW1 which is an analog switch. Consequently, in the electromagnetic induction pen 2 according to the present embodiment, a reduction in circuit scale is achieved as compared with the electromagnetic induction pen 2 according to the first embodiment.

A position detection system 1 according to the third embodiment of the present disclosure will next be described. The position detection system 1 according to the present embodiment is similar to the position detection system 1 according to the second embodiment except that the internal configuration of the resonance circuit 23 and the operation of the processing circuit 24 and the modulation circuit 25 are different from those of the position detection system 1 according to the second embodiment. Accordingly, in the following, description will be made by directing attention to differences from the position detection system 1 according to the second embodiment.

Figure 14:
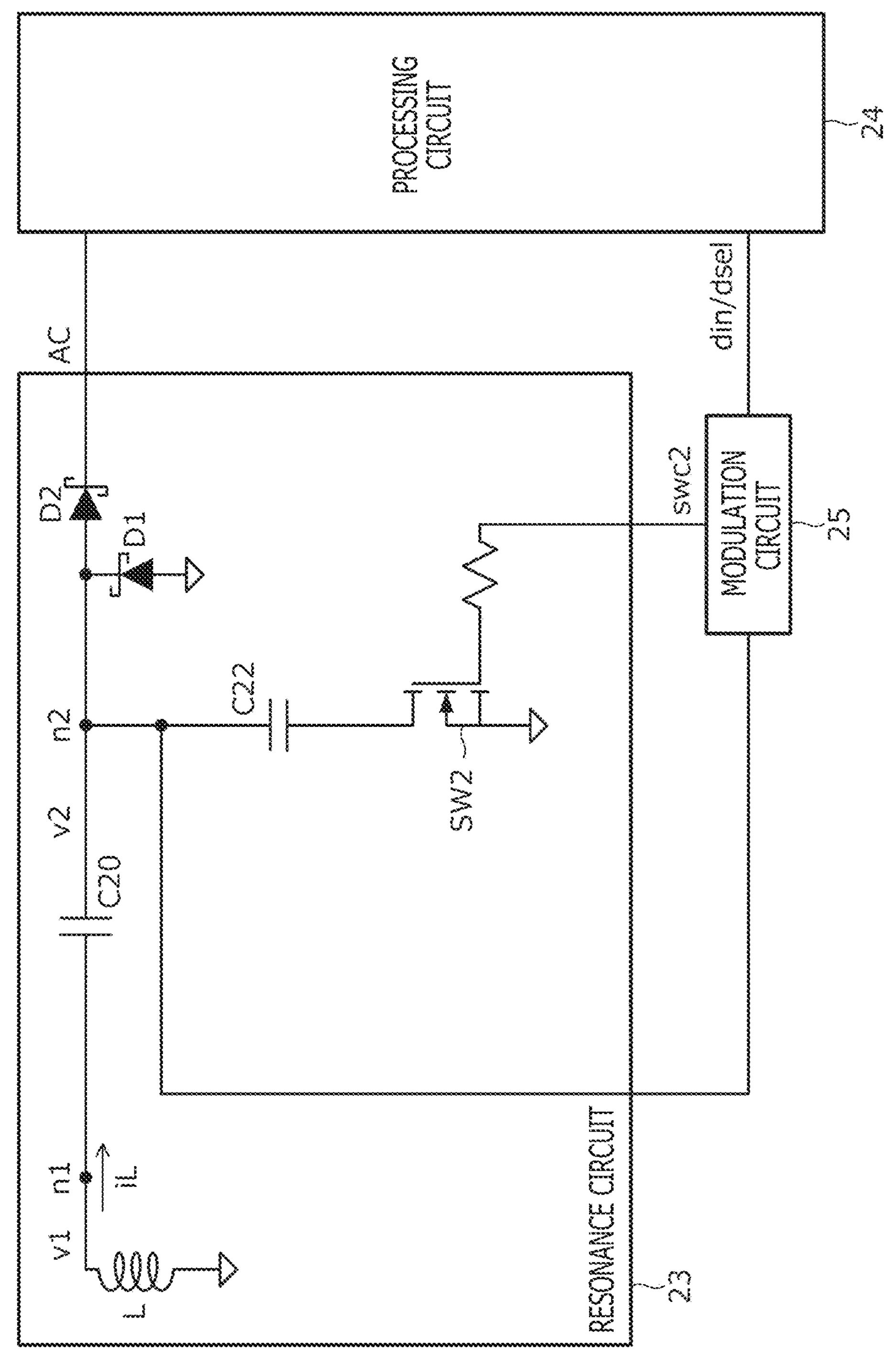
FIG. 14 is a diagram illustrating an internal configuration of a resonance circuit 23 according to a third embodiment of the present disclosure.

FIG. 14 is a diagram illustrating an internal configuration of the resonance circuit 23 according to the present embodiment. As is understood by comparing FIG. 14 with FIG. 10, the resonance circuit 23 according to the present embodiment is different from the resonance circuit 23 according to the second embodiment in that the resonance circuit 23 according to the present embodiment does not include the capacitor C0, in that the resonance circuit 23 according to the present embodiment does not include the selector SEL, and in that the resonance circuit 23 according to the present embodiment includes one capacitor C22 in place of the capacitors C0 to C16.

The capacitor C22 is connected between the node n2 and the drain of the switch element SW2. The selection signal dsel that is supplied to the selector SEL in the second embodiment is supplied to the modulation circuit 25 in the present embodiment. The selection signal dsel according to the present embodiment is not a signal for selecting one of the capacitors C1 to C16, and is a signal for selecting the length of a period during which the modulation circuit 25 maintains the capacitance of the capacitor C at the second capacitance.

The processing circuit 24 according to the present embodiment stores, in advance, a table that associates information of four bits and the length of the period during which the modulation circuit 25 maintains the capacitance of the capacitor C at the second capacitance with each other. Further, the processing circuit 24 is configured to, each time data DATA illustrated in FIG. 3 is to be transmitted, determine the length of a period corresponding to the data DATA to be transmitted, by referring to the above-described table, and supply the selection signal dsel indicating the determined length to the modulation circuit 25.

As with the modulation circuit 25 according to the second embodiment, the modulation circuit 25 according to the present embodiment performs processing of temporarily changing the capacitance of the capacitor C from the first capacitance to the second capacitance by controlling the on/off state of the switch element SW2 by using the control signal swc2. However, unlike the modulation circuit 25 according to the second embodiment, the modulation circuit 25 according to the present embodiment controls the switch element SW2 to an on state in an initial state (what is generally called a normally-on state). The modulation circuit 25 according to the present embodiment is configured to change the capacitance of the capacitor C from the first capacitance to the second capacitance by turning off the switch element SW2 and change the capacitance of the capacitor C from the second capacitance to the first capacitance by turning on the switch element SW2.

The switch element SW2 is controlled to an on state in the initial state in order to form a resonance circuit by the capacitor C22 and the coil L. This renders the capacitor C0 unnecessary in the present embodiment. The first capacitance according to the present embodiment is a combined capacitance of the capacitors C20 and C22. After the switch element SW2 is turned off, there is no capacitor connected to the coil L except the capacitor C20 in the circuit diagram of FIG. 14. In actuality, however, there is a parasitic capacitance in the switch element SW2. The coil L and the capacitor C22 are therefore not completely detached from each other. Hence, a resonance circuit is formed even in a state in which the switch element SW2 is set in an off state. The second capacitance according to the present embodiment is a combined capacitance of the capacitors C20 and C22 and the parasitic capacitance of the switch element SW2.

Timings at which the modulation circuit 25 according to the present embodiment turns on and off the switch element SW2 are controlled by the alternating current v2 appearing at the node n2 and the control signal din and the selection signal dsel supplied from the processing circuit 24. Specifically, the modulation circuit 25 controls the switch element SW2 to an off state at a timing at which a current iL flowing through the coil L becomes 0 while the control signal din is activated, and the modulation circuit 25 thereafter returns the switch element SW2 to an on state at a timing at which time of a length indicated by the selection signal dsel has passed. The switch element SW2 is turned off at a timing at which the current iL of the coil L is 0, in order to prevent a decrease in the level of the alternating current v1. According to such operation of the modulation circuit 25, the resonance frequency of the resonance circuit 23 is changed to the second frequency during the time of the length indicated by the selection signal dsel. The phase of the alternating current v1 whose frequency has been returned to the first frequency can therefore be controlled by information of four bits as a transmission target. In addition, the frequency of the resonance circuit 23 is changed from the first frequency to the second frequency during a very short period of time, and the frequency of the resonance circuit 23 is returned to the first frequency after the switch element SW2 is turned on. A decrease in the reception level in the quadrature detection performed by the position detecting device 3 therefore hardly occurs. Hence, the electromagnetic induction pen according to the present embodiment can also achieve a multilevel pen signal PS (specifically, four-bit phase modulation) without causing a decrease in the reception level in the quadrature detection of the position detecting device 3.

Figure 15:
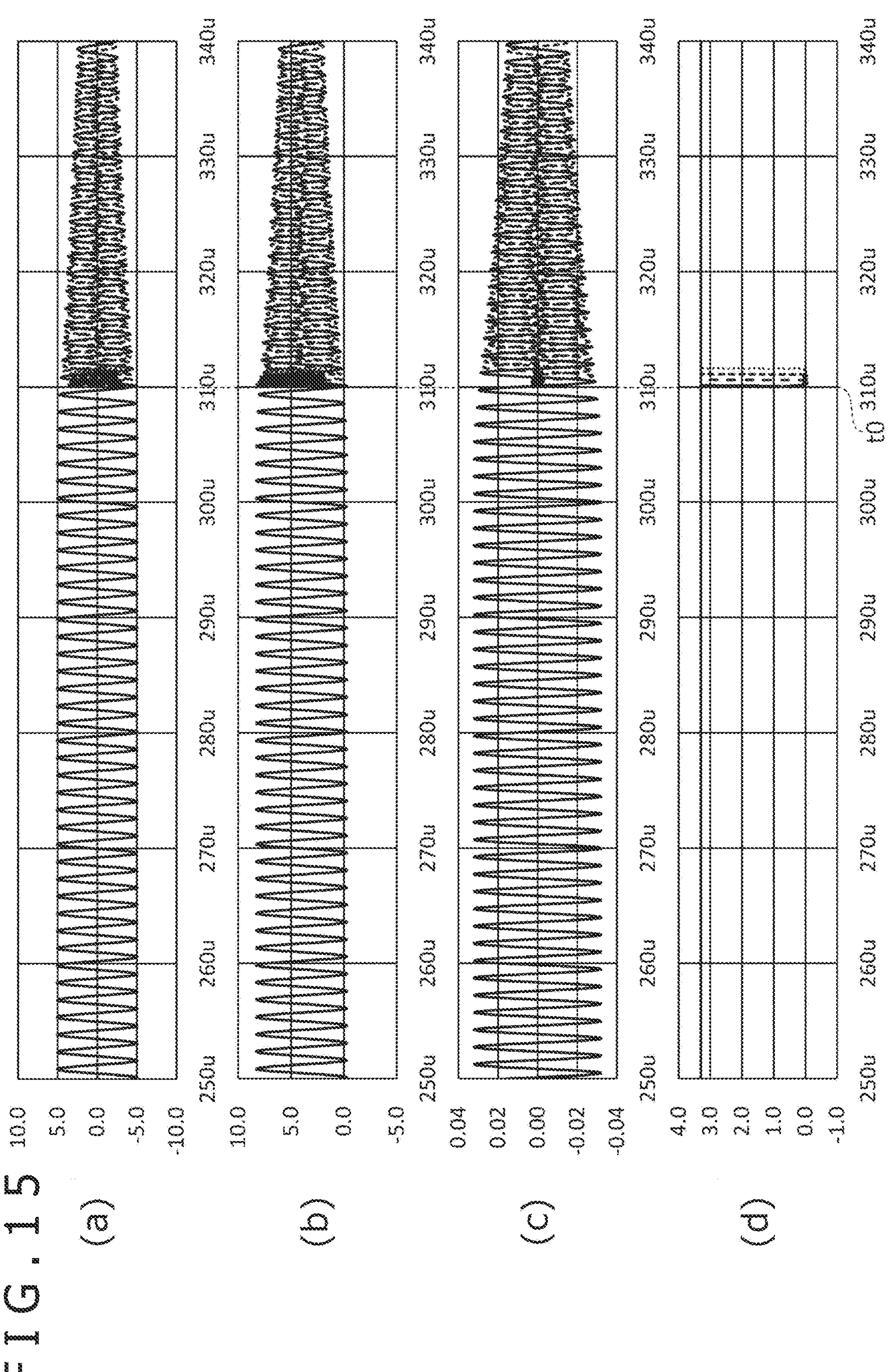
FIG. 15 is a diagram illustrating simulation waveforms of an alternating current v1, an alternating current v2, a current iL, and a control signal swc2 according to the third embodiment of the present disclosure.
Figure 16:
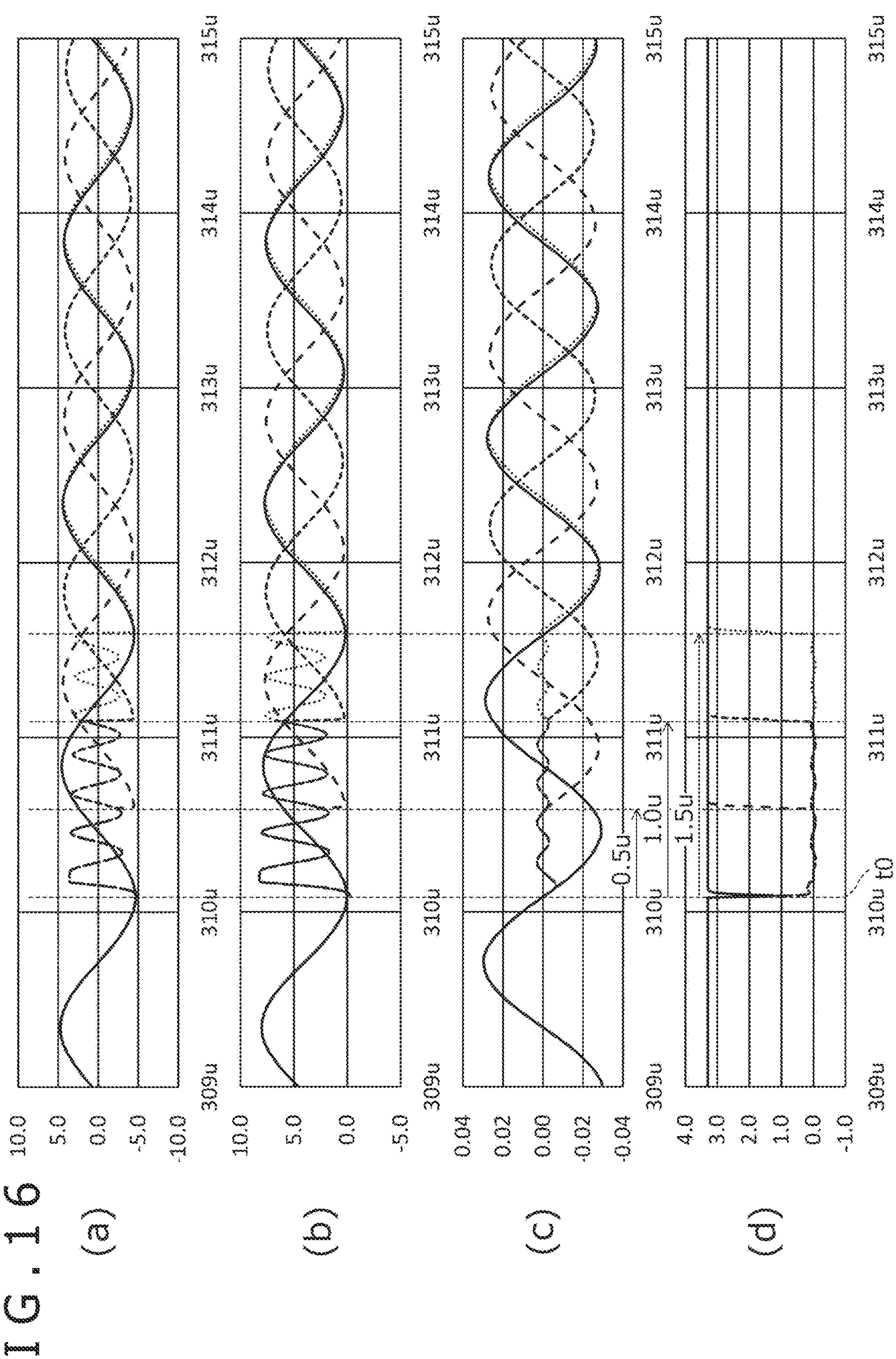
FIG. 16 is a diagram illustrating simulation waveforms of the alternating current v1, the alternating current v2, the current iL, and the control signal swc2 according to the third embodiment of the present disclosure.

FIG. 15 and FIG. 16 are diagrams illustrating simulation waveforms of the alternating current v1 (shown in (a), the alternating current v2 (shown in (b), the current iL (shown in (c), and the control signal swc2 (shown in (d) according to the present embodiment. At a time point at a left end of FIG. 15 (250 microseconds), the position detecting layer 3 is sending out the alternating magnetic field AM. In addition, at a time point at a right end of FIG. 15 (340 microseconds), the electromagnetic induction pen 2 is transmitting the pen signal PS as a reflection signal. FIG. 16 is an enlargement of the waveforms illustrated in FIG. 15 in a period from 309 microseconds to 315 microseconds.

In the simulation of FIG. 15 and FIG. 16, the capacitance of the capacitor C22 was set at 1755 pF. Other circuit constants were set to be the same values as those in the simulation of FIG. 12. In addition, the length of the period during which the modulation circuit 25 maintained the switch element SW2 in an off state was set at 0 microseconds, 0.5 microseconds, 1.0 microsecond, and 1.5 microseconds. In actuality, $2^n$ kinds of lengths need to be used in a case of performing n-bit phase modulation, for example, but are omitted in FIG. 15 and FIG. 16 because the drawings become difficult to view when all of the cases are included.

The modulation circuit 25 according to the present embodiment activates the control signal swc2 to low at a timing at which the alternating current v2 becomes 0 as illustrated in FIG. 16, that is, at a timing at which the current iL becomes 0 (time t0), while the control signal din (not illustrated in FIG. 15 and FIG. 16) is activated. Then, the control signal swc2 is returned to high at a timing at which the time of the length indicated by the selection signal dsel (not illustrated in FIG. 15 and FIG. 16) has passed.

When the control signal swc2 is changed to low, the capacitance of the capacitor C changes from the first capacitance to the second capacitance, and the frequency of the alternating current v1 is thereby raised. However, this frequency (second frequency) is maintained while the control signal swc2 is low, as illustrated in FIG. 16. Hence, a timing at which the resonance frequency of the resonance circuit 23 is returned to the first frequency is different according to the length of the time during which the capacitance of the capacitor C is the second capacitance. As a result, as illustrated in FIG. 16, the phase of the alternating current v2 after returning to oscillation at the first frequency is changed by an amount corresponding to the length of the time during which the capacitance of the capacitor C is the second capacitance, as compared with the phase of the alternating current v2 obtained before the capacitance of the capacitor C becomes the second capacitance. Hence, it can be said that, also in the simulation of FIG. 15 and FIG. 16, the changing, by an amount corresponding to the information as the transmission target, of the phase of the pen signal PS transmitted at the first frequency is achieved.

As described above, the electromagnetic induction pen 2 according to the present embodiment can also control the phase of the pen signal PS transmitted at the first frequency, on the basis of the information as the transmission target, and can therefore achieve a multilevel pen signal PS without causing a decrease in the reception level in the quadrature detection of the position detecting device 3.

A position detection system 1 according to the fourth embodiment of the present disclosure will next be described. The position detection system 1 according to the present embodiment is similar to the position detection system 1 according to the third embodiment except that the internal configuration of the resonance circuit 23 and the operation of the modulation circuit 25 in the position detection system 1 according to the present embodiment are different from those of the position detection system 1 according to the third embodiment. Accordingly, in the following, description will be made by directing attention to differences from the position detection system 1 according to the third embodiment.

Figure 17:
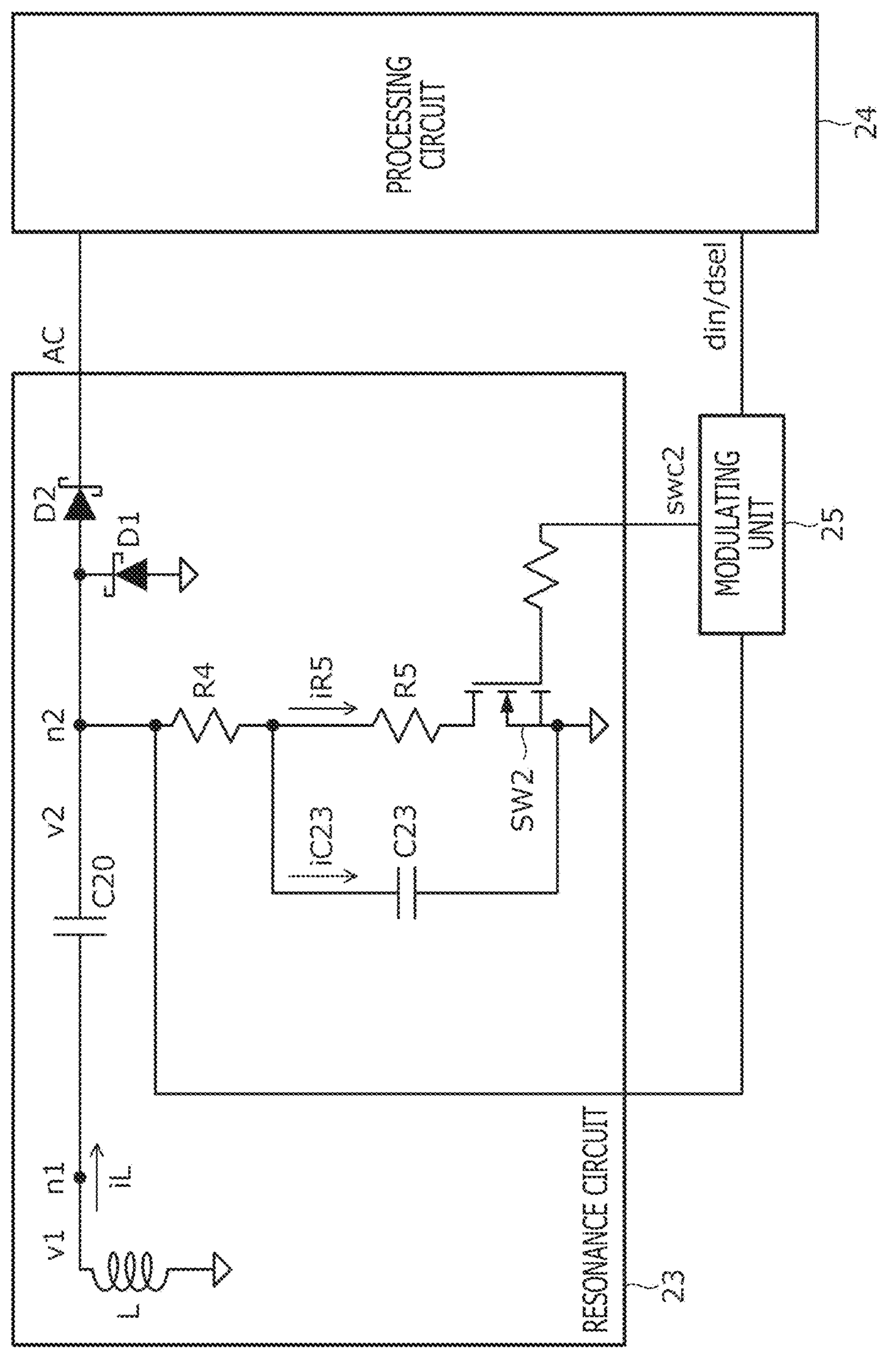
FIG. 17 is a diagram illustrating an internal configuration of a resonance circuit 23 according to a fourth embodiment of the present disclosure.

FIG. 17 is a diagram illustrating an internal configuration of the resonance circuit 23 according to the present embodiment. As is understood by comparing FIG. 17 with FIG. 14, the resonance circuit 23 according to the present embodiment is different from the resonance circuit 23 according to the third embodiment in that the resonance circuit 23 according to the present embodiment includes a capacitor C23 and resistances R4 and R5 in place of the capacitor C22.

The resistances R4 and R5 are connected in series with each other in this order between the node n2 and the switch element SW2. One electrode of the capacitor C23 is connected to a point of connection between the resistances R4 and R5. Another electrode of the capacitor C23 is connected to the source of the switch element SW2.

Unlike the modulation circuit 25 according to the third embodiment, the modulation circuit 25 according to the present embodiment controls the switch element SW2 to an off state in an initial state (what is generally called a normally-off state). In the present embodiment, a resonance circuit is formed by the capacitors C20 and C23 and the coil L when the switch element SW2 is off. The first capacitance according to the present embodiment is a combined capacitance of the capacitors C20 and C23. When the switch element SW2 is on, on the other hand, the capacitor C23 is short-circuited, and therefore, a resonance circuit is formed by the capacitor C20 and the coil L. The second capacitance according to the present embodiment is the capacitance of the capacitor C20 alone.

In addition, the modulation circuit 25 according to the present embodiment is configured to change the capacitance of the capacitor C from the first capacitance to the second capacitance by turning on the switch element SW2 and change the capacitance of the capacitor C from the second capacitance to the first capacitance by turning off the switch element SW2. As in the third embodiment, timings at which the modulation circuit 25 turns on and off the switch element SW2 are controlled by the alternating current v2 appearing at the node n2 and the control signal din and the selection signal dsel supplied from the processing circuit 24.

Specifically, the modulation circuit 25 according to the present embodiment controls the switch element SW2 to an on state while the control signal din is activated, and the modulation circuit 25 thereafter returns the switch element SW2 to an off state at a timing at which the time of the length indicated by the selection signal dsel has passed. According to such operation of the modulation circuit 25, as in the third embodiment, the resonance frequency of the resonance circuit 23 is changed to the second frequency during the time of the length indicated by the selection signal dsel. The phase of the alternating current v1 whose frequency has been returned to the first frequency can therefore be controlled by information of four bits as a transmission target. In addition, the frequency of the resonance circuit 23 is changed from the first frequency to the second frequency during a very short period of time, and the frequency of the resonance circuit 23 is returned to the first frequency after the switch element SW2 is turned off. A decrease in the reception level in the quadrature detection performed by the position detecting device 3 therefore hardly occurs. Hence, the electromagnetic induction pen according to the present embodiment can also achieve a multilevel pen signal PS (specifically, four-bit phase modulation) without causing a decrease in the reception level in the quadrature detection of the position detecting device 3.

Figure 18:
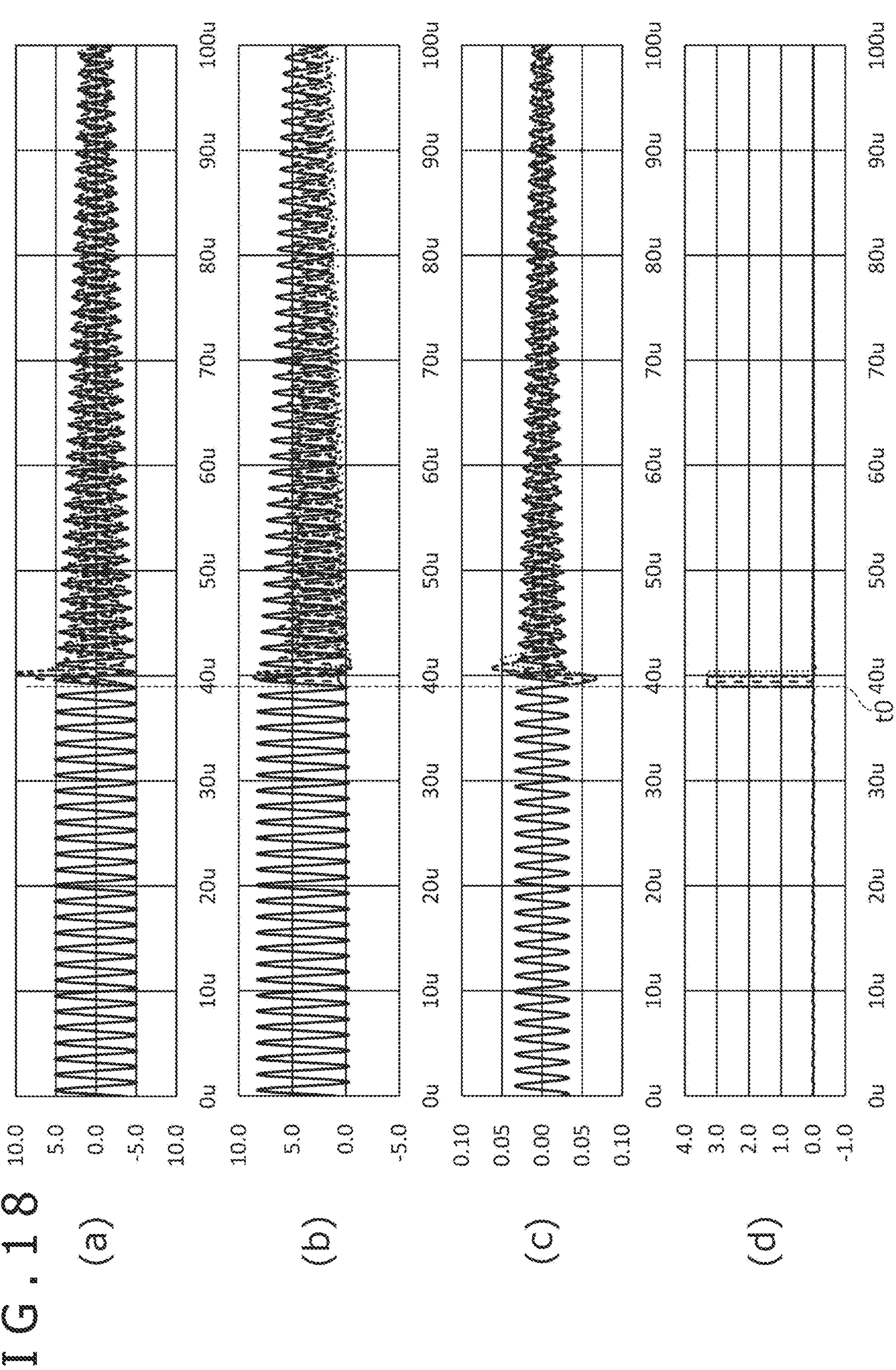
FIG. 18 is a diagram illustrating simulation waveforms of an alternating current v1, an alternating current v2, a current iL, and a control signal swc2 according to the fourth embodiment of the present disclosure.
Figure 19:
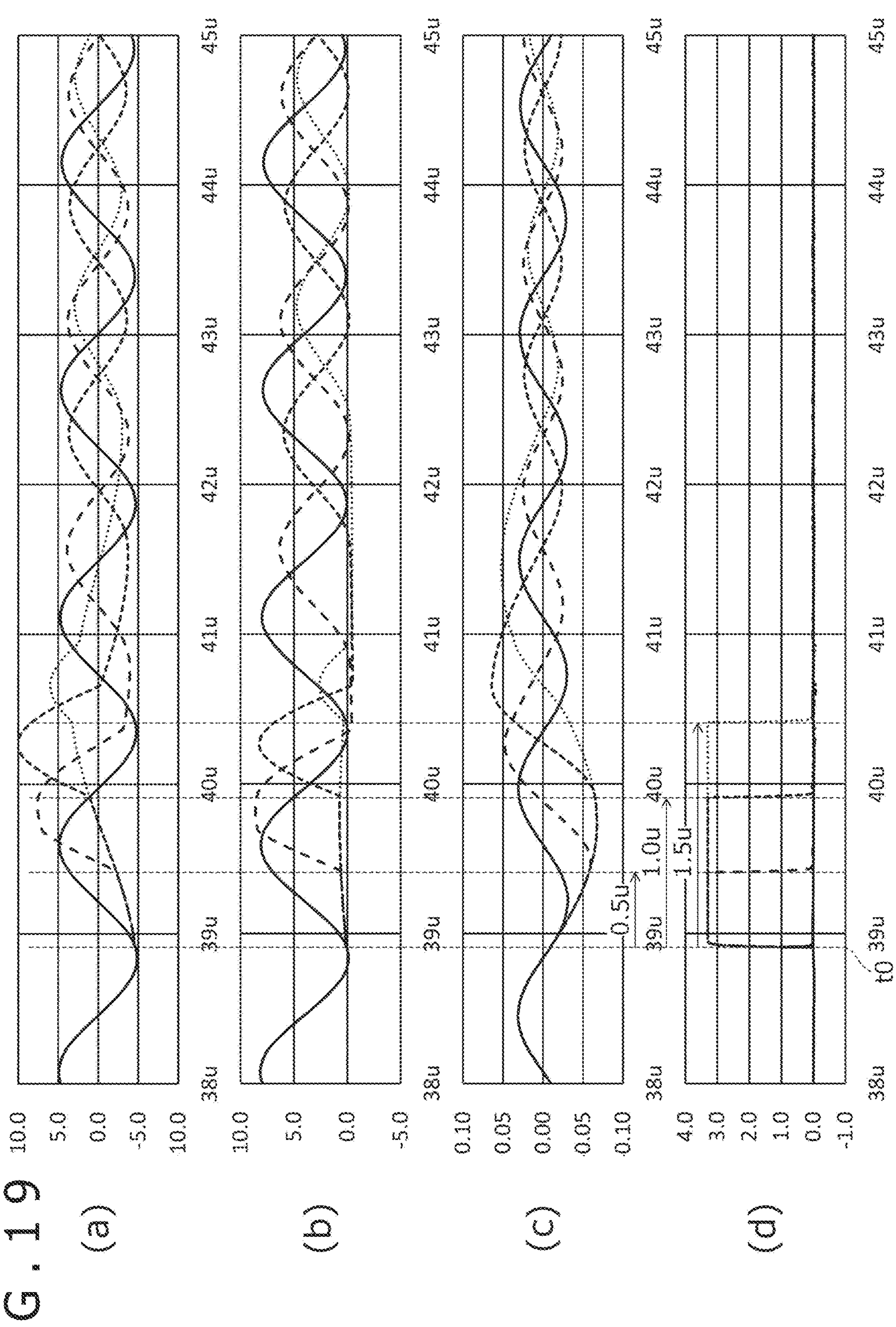
FIG. 19 is a diagram illustrating simulation waveforms of the alternating current v1, the alternating current v2, the current iL, and the control signal swc2 according to the fourth embodiment of the present disclosure.
Figure 20:
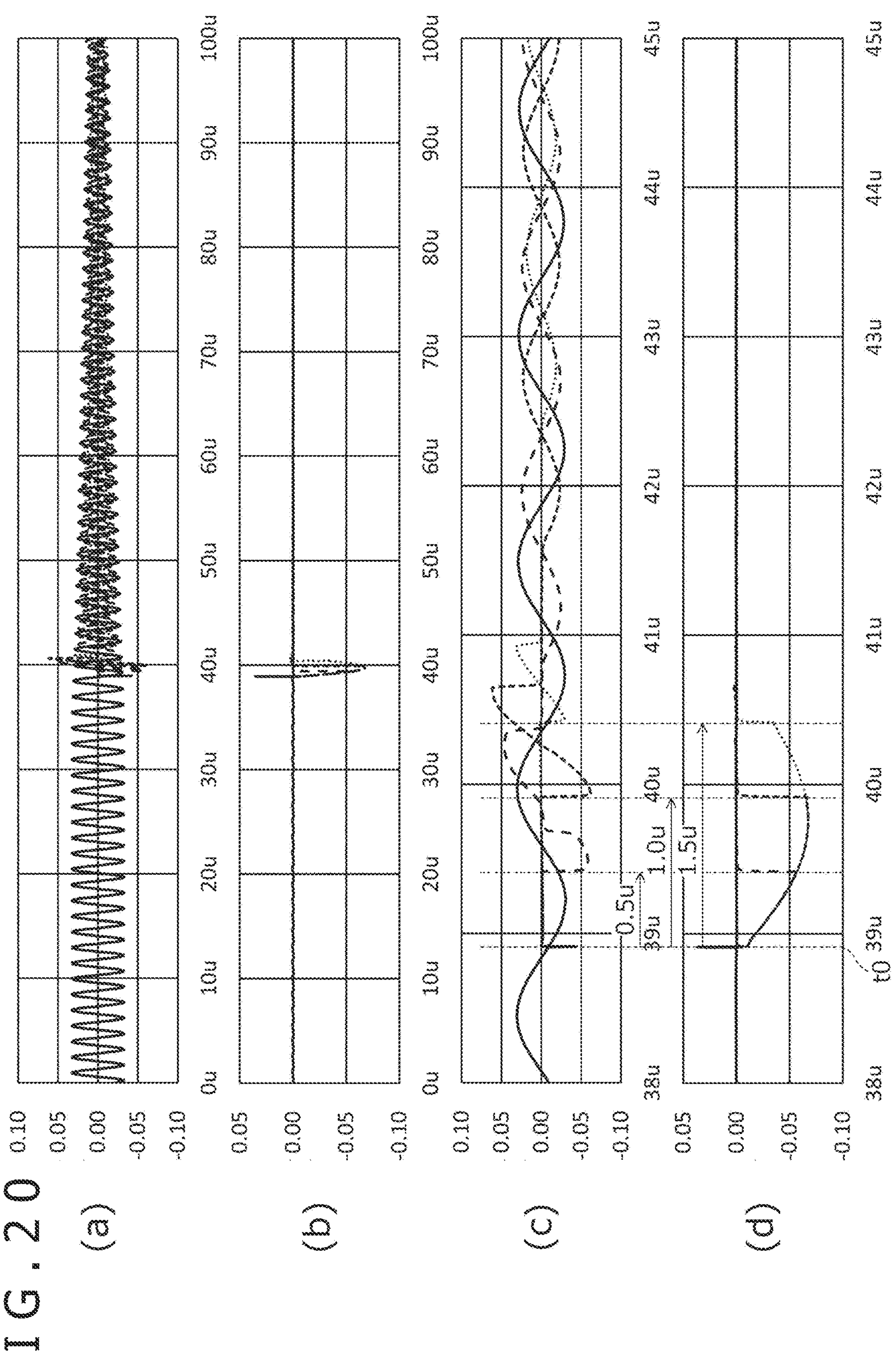
FIG. 20 is a diagram illustrating simulation waveforms of a current iC23 and a current iR5 according to the fourth embodiment of the present disclosure.

FIG. 18 and FIG. 19 are diagrams illustrating simulation waveforms of the alternating current v1 (shown in (a), the alternating current v2 (shown in (b), the current iL (shown in (c), and the control signal swc2 (shown in (d) according to the present embodiment. In addition, FIG. 20 is a diagram illustrating simulation waveforms of a current iC23 flowing through the capacitor C23 and a current iR5 flowing through the resistance R5. At a time point at left ends of FIG. 18 as well as (a) and (b) in FIG. 20 (0 microseconds), the position detecting layer 3 is sending out the alternating magnetic field AM. In addition, at a time point at right ends of FIG. 18 as well as (a) and (b) in FIG. 20 (100 microseconds), the electromagnetic induction pen 2 is transmitting the pen signal PS as a reflection signal. FIG. 19 is an enlargement of the waveforms illustrated in FIG. 18 in a period from 38 microseconds to 42 microseconds. In addition, (c) and (d) in FIG. 20 are respectively enlargements of the waveforms illustrated in (a) and (b) in FIG. 20 in a period from 38 microseconds to 45 microseconds.

In the simulation of FIGS. 18 to 20, the capacitance of the capacitor C23 was set at 8481 pF, the resistance value of the resistance R4 was set at 1 mΩ, and the resistance value of the resistance R5 was set at 10Ω. Other circuit constants were set to be the same values as those in the simulation of FIG. 15. In addition, the length of the time during which the modulation circuit 25 maintained the switch element SW2 in an on state was set at 0 microseconds, 0.5 microseconds, 1.0 microsecond, and 1.5 microseconds. In actuality, $2^n$ kinds of lengths need to be used in a case of performing n-bit phase modulation, for example, but are omitted in FIG. 18, FIG. 19, and FIG. 20 because the drawings become difficult to view when all of the cases are included.

The modulation circuit 25 according to the present embodiment changes the control signal swc2 to high, as illustrated in FIG. 19, while the control signal din (not illustrated in FIGS. 18 to 20) is activated. Then, the control signal swc2 is returned to low at a timing at which the time of the length indicated by the selection signal dsel (not illustrated in FIGS. 18 to 20) has passed.

When the control signal swc2 is changed to high, the capacitance of the capacitor C changes from the first capacitance to the second capacitance, and the frequency of the alternating current v1 is thereby lowered. However, this frequency (second frequency) is maintained while the control signal swc2 is high, as illustrated in FIG. 19. Hence, a timing at which the resonance frequency of the resonance circuit 23 is returned to the first frequency is different according to the length of the time during which the capacitance of the capacitor C is the second capacitance. As a result, as illustrated also in FIG. 19, the phase of the alternating current v2 after returning to oscillation at the first frequency is changed by an amount corresponding to the length of the time during which the capacitance of the capacitor C is the second capacitance, as compared with the phase of the alternating current v2 obtained before the capacitance of the capacitor C becomes the second capacitance. Hence, it can be said that, also in the simulation of FIGS. 18 to 20, the changing, by an amount corresponding to the information as the transmission target, of the phase of the pen signal PS transmitted at the first frequency is achieved.

Figure 21:
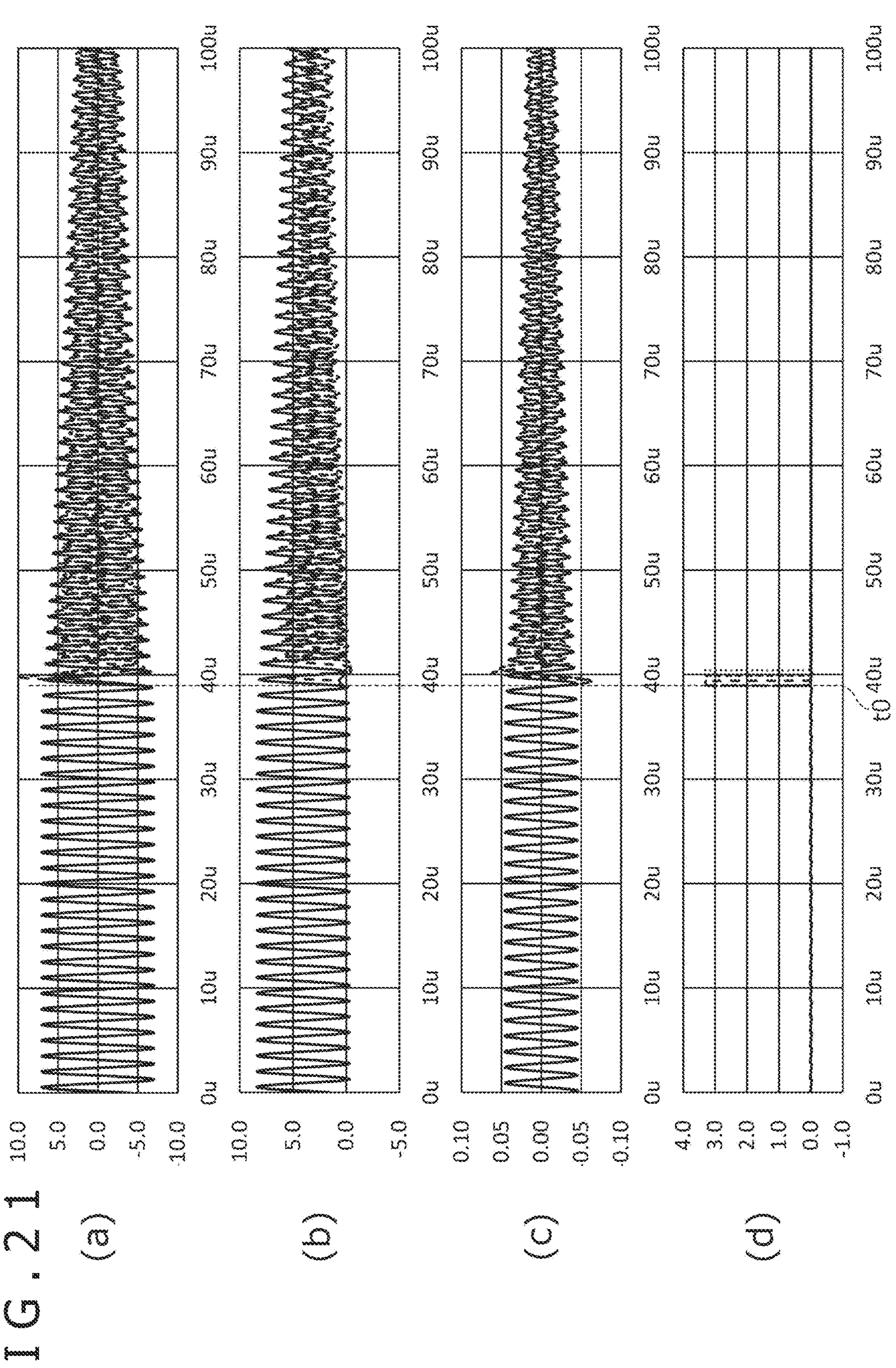
FIG. 21 is a diagram illustrating simulation waveforms of the alternating current v1, the alternating current v2, the current iL, and the control signal swc2 according to another example of the fourth embodiment of the present disclosure.
Figure 22:
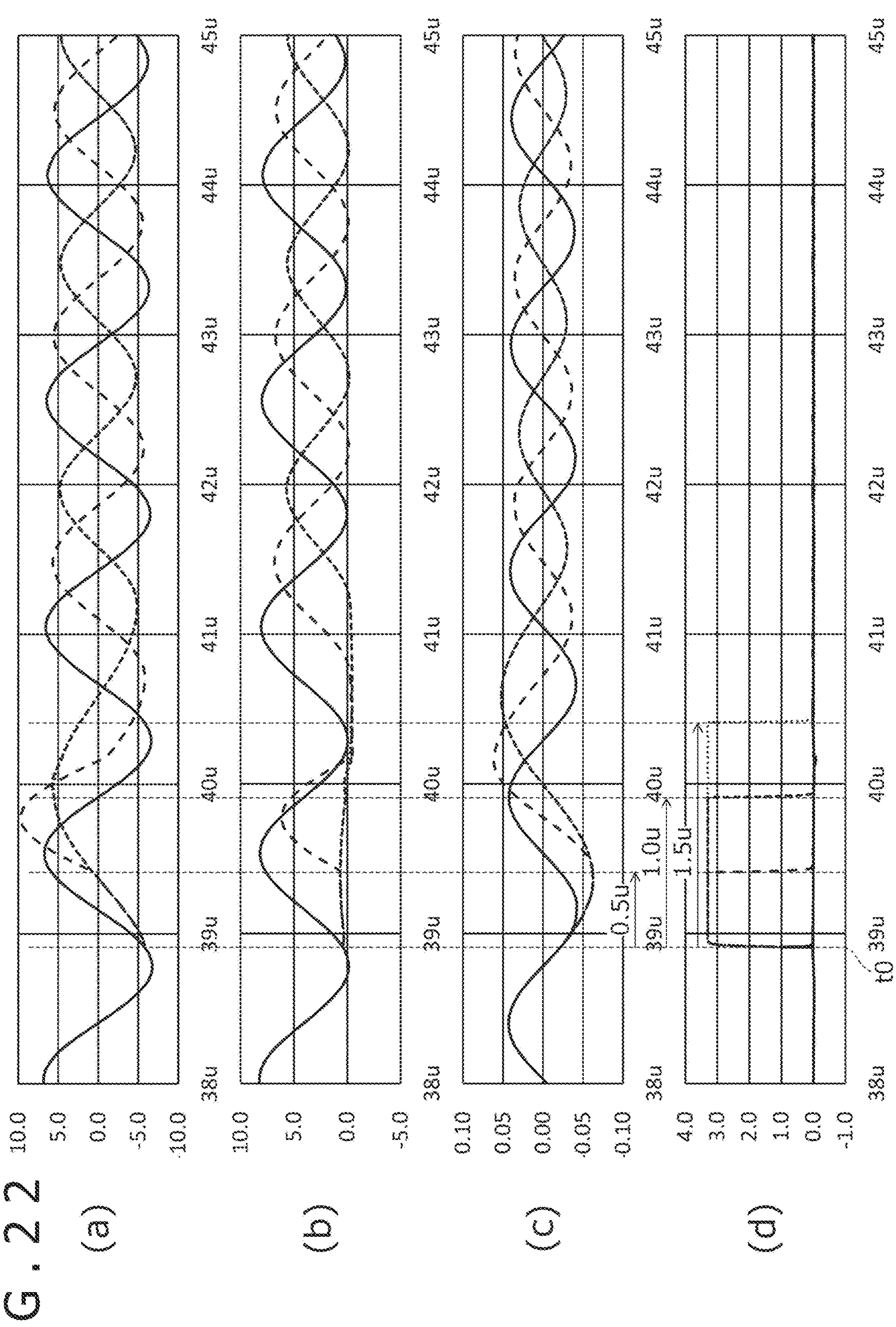
FIG. 22 is a diagram illustrating simulation waveforms of the alternating current v1, the alternating current v2, the current iL, and the control signal swc2 according to the other example of the fourth embodiment of the present disclosure.

FIG. 21 and FIG. 22 are diagrams illustrating simulation waveforms of the alternating current v1 (shown in (a), the alternating current v2 (shown in (b), the current iL (shown in (c), and the control signal swc2 (shown in (d) according to another example of the present embodiment. Details of simulation of FIG. 21 and FIG. 22 are similar to those of the simulation of FIGS. 18 to 20 except that the capacitance of the capacitor C20 was set at 4 nF and that the capacitance of the capacitor C23 was set at 2481 p.

It is understood by viewing FIG. 21 and FIG. 22 that the level of the alternating current v1 obtained after the control signal swc2 is returned to low is raised as compared with the example of FIG. 18 and FIG. 19. On the other hand, in the simulation of FIG. 21 and FIG. 22, a width by which the phase can be changed is decreased as compared with the simulation of FIG. 18 and FIG. 19. It is understood from this result that the capacitance of the capacitors C20 and C23 need to be determined appropriately in order to be able to change the phase as greatly as possible while suppressing a decrease in the level of the alternating current v1. For example, when the capacitance of the capacitor C20 is set at 4 nF and the capacitance of the capacitor C23 is set at 2449 p, it is possible to change the phase from 0° to 220° while preventing a decrease in the level of the alternating current v1 obtained after the control signal swc2 is returned to low.

As described above, the electromagnetic induction pen 2 according to the present embodiment can also control the phase of the pen signal PS transmitted at the first frequency, on the basis of the information as the transmission target, and can therefore achieve a multilevel pen signal PS without causing a decrease in the reception level in the quadrature detection of the position detecting device 3.

In addition, the electromagnetic induction pen 2 according to the present embodiment can make the initial state of the switch element SW2 an off state. The circuit can therefore be realized easily as compared with the electromagnetic induction pen 2 according to the third embodiment that necessitates the normally-on switch element SW2.

A position detection system 1 according to the fifth embodiment of the present disclosure will next be described. The position detection system 1 according to the present embodiment is similar to the position detection system 1 according to the first embodiment except that the internal configuration of the resonance circuit 23 and the operation of the processing circuit 24 and the modulation circuit 25 are different from those of the position detection system 1 according to the first embodiment. Accordingly, in the following, description will be made by directing attention to differences from the position detection system 1 according to the first embodiment.

Figure 23:
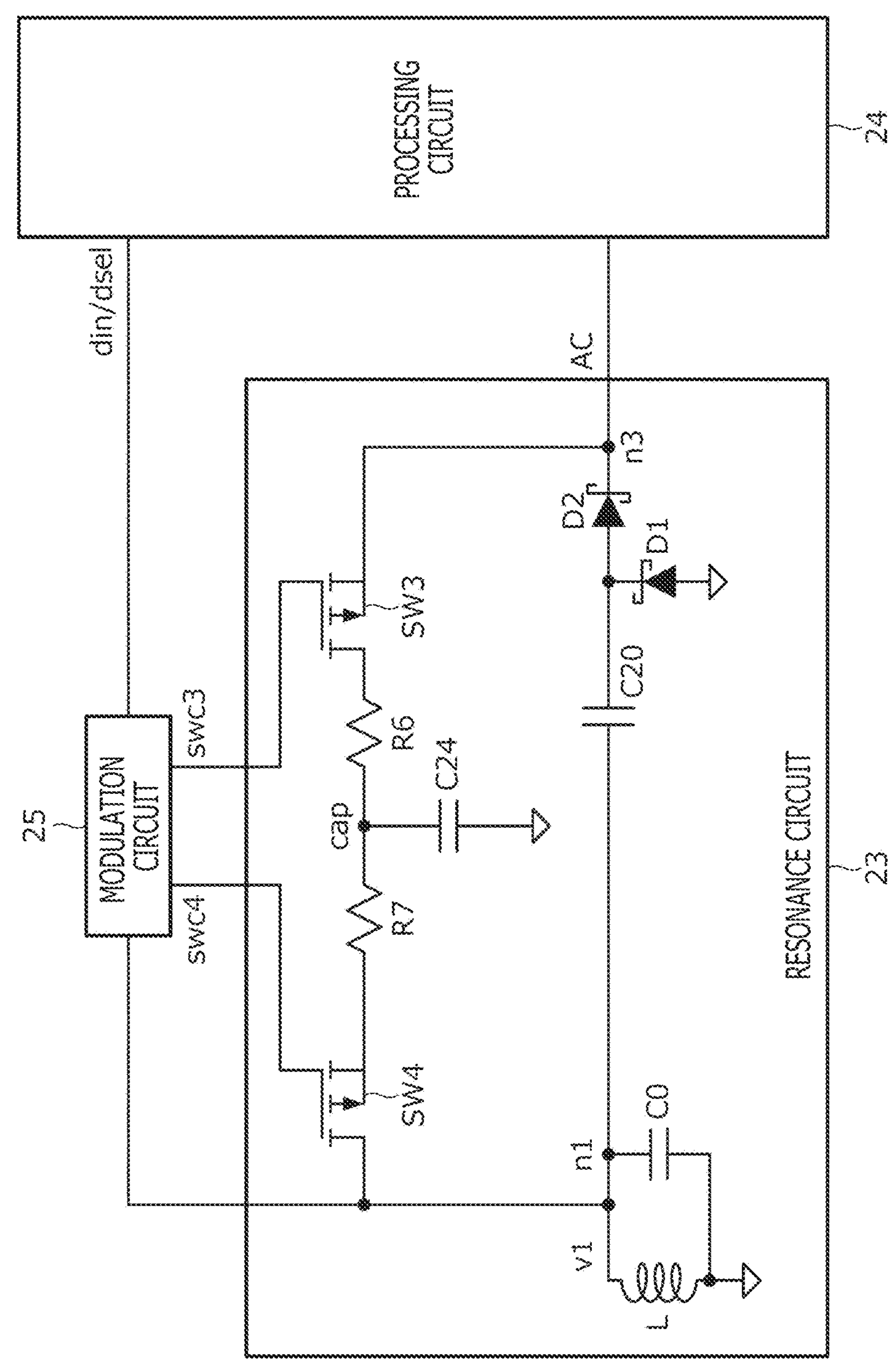
FIG. 23 is a diagram illustrating an internal configuration of a resonance circuit 23 according to a fifth embodiment of the present disclosure.

FIG. 23 is a diagram illustrating an internal configuration of the resonance circuit 23 according to the present embodiment. As is understood by comparing FIG. 23 with FIG. 4, the resonance circuit 23 according to the present embodiment is different from the resonance circuit 23 according to the first embodiment in that the resonance circuit 23 according to the present embodiment includes neither of the switch element SW1 and the selector SEL, in that the resonance circuit 23 according to the present embodiment includes one capacitor C24 in place of the capacitors C0 to C16, in that the resonance circuit 23 according to the present embodiment includes resistances R6 and R7, and in that the resonance circuit 23 according to the present embodiment includes switch elements SW3 and SW4.

The switch elements SW3 and SW4 are each a P-channel MOSFET. A drain of the switch element SW3 is connected to one electrode of the capacitor C24 via the resistance R6. A source of the switch element SW3 is connected to a node n3 formed by the cathode of the diode D2. A drain of the switch element SW4 is connected to the node n1. A source of the switch element SW4 is connected to the one electrode of the capacitor C24 via the resistance R7. Another electrode of the capacitor C24 is connected to the grounding terminal.

The processing circuit 24 according to the present embodiment stores, in advance, a table that associates information of four bits and a timing at which the modulation circuit 25 changes the capacitance of the capacitor C from the first capacitance to the second capacitance with each other. Further, each time data DATA illustrated in FIG. 3 is to be transmitted, the processing circuit 24 determines a timing corresponding to the data DATA to be transmitted, by referring to the above-described table, and supplies the selection signal dsel indicating the determined timing to the modulation circuit 25. Incidentally, the timing indicated by the selection signal dsel is specifically identified by elapsed time from a predetermined timing (for example, a timing at which the alternating current v1 changes from negative to positive) that arrives while the control signal din is activated.

The modulation circuit 25 according to the present embodiment charges the capacitor C24 by temporarily turning on the switch element SW3 before the sending out of the alternating magnetic field AM by the position detecting device 3 is ended, and the modulation circuit 25 performs processing of temporarily changing the capacitance of the capacitor C from the first capacitance (capacitance of the capacitor C0 alone) to the second capacitance (combined capacitance of the capacitors C0 and C24) by temporarily turning on the switch element SW4 after the sending out of the alternating magnetic field AM by the position detecting device 3 is ended. Timings at which the modulation circuit 25 turns on and off the switch element SW3 are determined such that the charging is completed before the control signal din is activated. Specifically, it suffices for the modulation circuit 25 to be configured to turn on the switch element SW3 after predetermined time has elapsed from the occurrence of the alternating current v1 and further turn off the switch element SW3 after predetermined time has elapsed. On the other hand, timings at which the modulation circuit 25 turns on and off the switch element SW4 are controlled by the control signal din and the selection signal dsel supplied from the processing circuit 24.

Specifically, when the modulation circuit 25 according to the present embodiment detects that the above-described predetermined timing has arrived while the control signal din is activated, the modulation circuit 25 waits for the passage of the elapsed time indicated by the selection signal dsel from the detection. The modulation circuit 25 then controls the switch element SW4 to an on state. In addition, the switch element SW4 is controlled to an off state when predetermined time has passed after the switch element SW4 is controlled to an on state. In the present embodiment, the capacitor C24 has been charged in a stage before the modulation circuit 25 turns on the switch element SW4. Thus, the level of the alternating current v1 rises sharply after the switch element SW4 is turned on. The frequency of the alternating current v1 at this time is not stable, but is at least a value (second frequency) different from the first frequency. When the switch element SW4 is returned to an off state, the level of the alternating current v1 is gradually stabilized. However, due to an effect of the temporary sharp rise in the level, the phase is changed as compared with the phase obtained before the switch element SW4 is turned on. Moreover, an amount of change in the phase is different according to the timing indicated by the selection signal dsel. Hence, the operation of the modulation circuit 25 according to the present embodiment can also control the phase of the alternating current v1 whose frequency has been returned to the first frequency, by information of four bits as a transmission target. In addition, the level of the alternating current v1 is temporarily changed during a very short period of time, and soon returns to oscillation at the first frequency after the switch element SW4 is turned off. A decrease in the reception level in the quadrature detection performed by the position detecting device 3 therefore hardly occurs. Hence, the electromagnetic induction pen according to the present embodiment can also achieve a multilevel pen signal PS (specifically, four-bit phase modulation) without causing a decrease in the reception level in the quadrature detection of the position detecting device 3.

Figure 24:
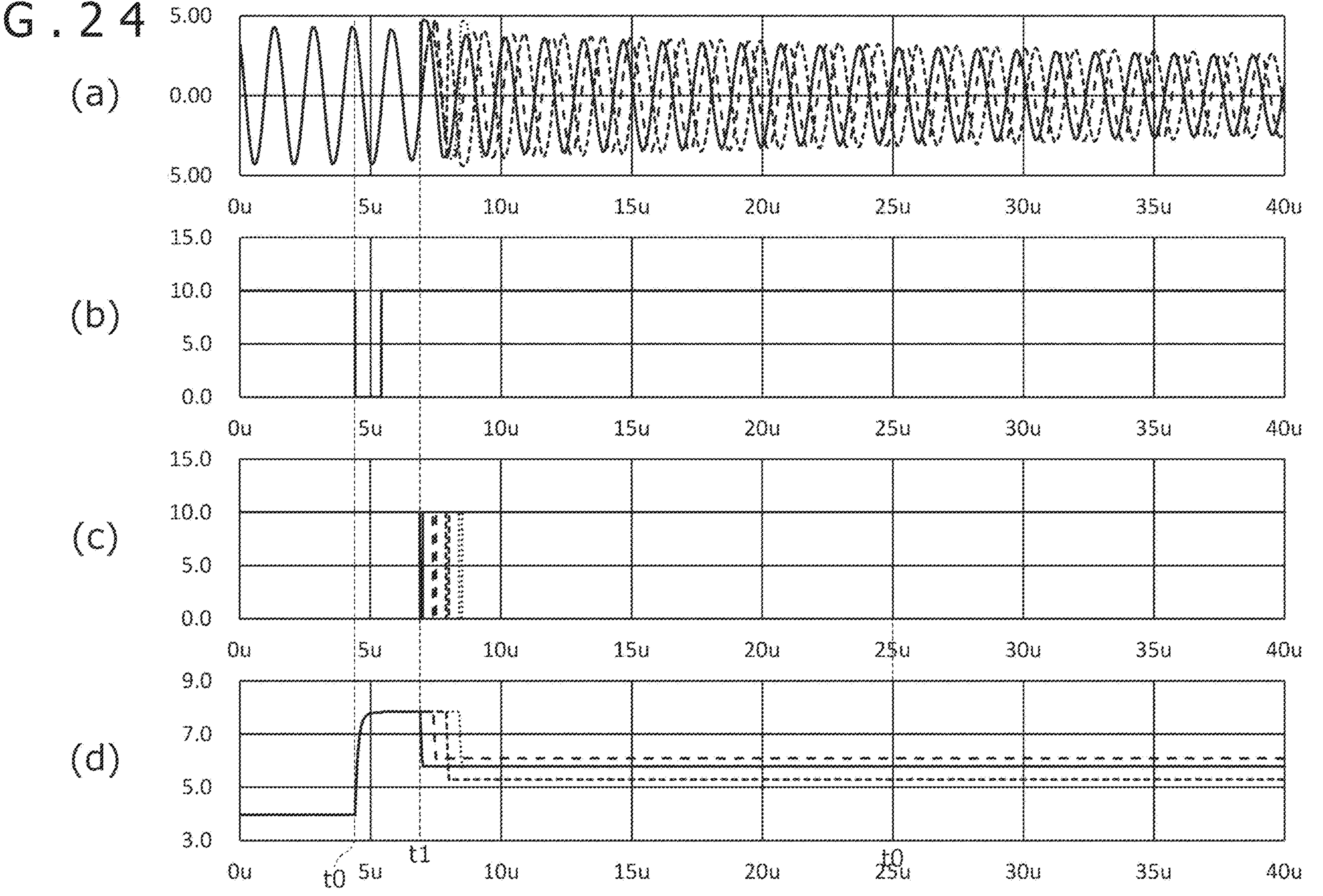
FIG. 24 is a diagram illustrating simulation waveforms of an alternating current v1, a control signal swc3, a control signal swc4, and a voltage signal cap according to the fifth embodiment of the present disclosure.
Figure 25:
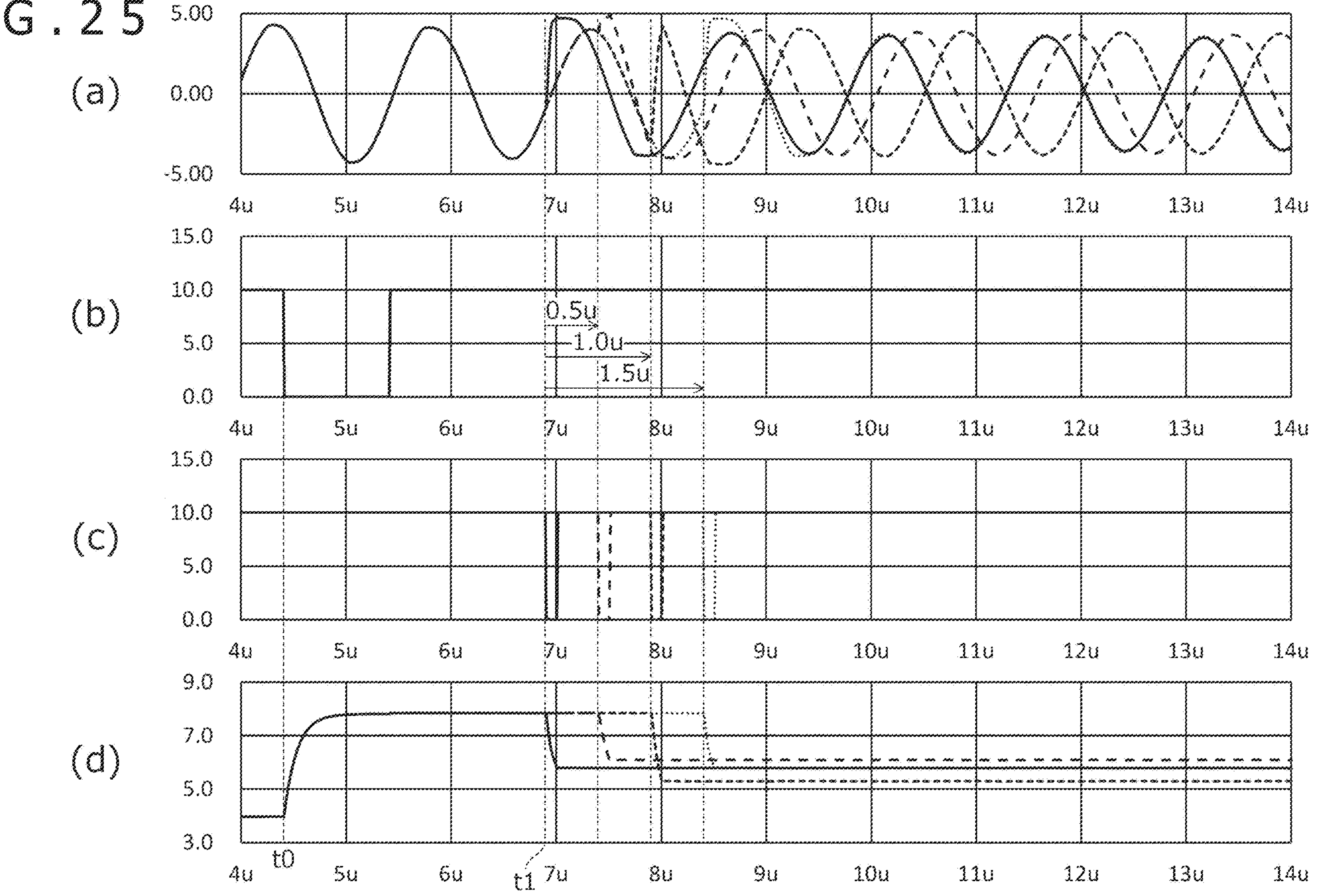
FIG. 25 is a diagram illustrating simulation waveforms of the alternating current v1, the control signal swc3, the control signal swc4, and the voltage signal cap according to the fifth embodiment of the present disclosure.

FIG. 24 and FIG. 25 are diagrams illustrating simulation waveforms of the alternating current v1 (shown in (a), a control signal swc3 (shown in (b), a control signal swc4 (shown in (c), and a voltage signal cap (shown in (d) appearing at the one electrode of the capacitor C24 according to the present embodiment. At a time point at a left end of FIG. 24 (0 microseconds), the position detecting layer 3 is sending out the alternating magnetic field AM. In addition, at a time point at a right end of FIG. 24 (40 microseconds), the electromagnetic induction pen 2 is transmitting the pen signal PS as a reflection signal. FIG. 25 is an enlargement of the waveforms illustrated in FIG. 24 in a period from 4 microseconds to 14 microseconds.

In the simulation of FIG. 24 and FIG. 25, the capacitance of the capacitor C24 was set at 5 nF, and the resistance values of the resistances R6 and R7 were both set at 20Ω. Other circuit constants were set to be the same values as those in the simulation of FIG. 6. In addition, the length of the elapsed time from the predetermined timing that arrives while the control signal din was activated to the changing of the control signal swc4 to low was set at 0 microseconds, 0.5 microseconds, 1.0 microsecond, and 1.5 microseconds. In actuality, $2^n$ kinds of lengths need to be used in a case of performing n-bit phase modulation, for example, but are omitted in FIG. 24 and FIG. 25 because the drawings become difficult to view when all of the cases are included. The length of time during which the control signal swe4 was maintained to be low was set at 0.1 microseconds.

Described first with reference to FIG. 24, the modulation circuit 25 according to the present embodiment changes the control signal swc3 to low over predetermined time from time to which is before the reception of the alternating magnetic field AM is ended. The voltage signal cap thereby rises to charge the capacitor C24. It suffices to make a specific length of the time during which the control signal swc3 is maintained to be low a necessary and sufficient length for completing the charging of the capacitor C24 before the reception of the alternating magnetic field AM is ended.

When the modulation circuit 25 thereafter detects that a predetermined timing (a timing at which the control signal din is activated, a timing at which the control signal din returns to a deactivated state, a timing at which the alternating current v1 changes from negative to positive, or the like) has arrived at time t1 illustrated in the figure while the control signal din (not illustrated in FIG. 24 and FIG. 25) is activated, the modulation circuit 25 waits for the passage of the elapsed time indicated by the selection signal dsel from the detection. The modulation circuit 25 then controls the switch element SW4 to an on state over a period of 0.1 microseconds.

Immediately after the modulation circuit 25 controls the switch element SW4 to an on state, the level of the alternating current v1 rises sharply, as illustrated in FIG. 25. This is because the capacitor C24 has been charged in a stage before the switch element SW4 is turned on. When the switch element SW4 thereafter returns to an off state, the level of the alternating current v1 is gradually stabilized and returns to oscillation at the first frequency. However, as illustrated in FIG. 25, the phase of the alternating current v1 whose frequency has been returned to the first frequency is changed according to the timing at which the modulation circuit 25 turns on the switch element SW4 as compared with the phase of the alternating current v1 obtained before the switch element SW4 is controlled to an on state. Hence, it can be said that, also in the present embodiment, the changing, by an amount corresponding to the information as the transmission target, of the phase of the pen signal PS transmitted at the first frequency is achieved.

As described above, the electromagnetic induction pen 2 according to the present embodiment can also control the phase of the pen signal PS transmitted at the first frequency, on the basis of the information as the transmission target, and can therefore achieve a multilevel pen signal PS without causing a decrease in the reception level in the quadrature detection of the position detecting device 3. In addition, the electromagnetic induction pen 2 according to the present embodiment can control the phase over 360° almost without decreasing the level of the alternating current v1.

The preferred embodiments of the present disclosure have been described above. However, the present disclosure is not at all limited to such embodiments, and, needless to say, the present disclosure can be carried out in various modes without departing from the spirit of the present disclosure.

DESCRIPTION OF REFERENCE SYMBOLS

1: Position detection system
2: Electromagnetic induction pen
3: Position detecting device
11: Comparator
12: D-type flip-flop circuit
20: Core body
21: Pressure sensor
22: Side switch
23: Resonance circuit
24: Processing circuit
25: modulation circuit
26: Control circuit
30: Switch unit
31: Sensor controller
32: Host processor
C, C0 to C16, C21 to C24: Capacitor
D1 to D3: Diode
AM: Alternating magnetic field
PS: Pen signal
L: Coil
LC: Loop coil
R1 to R7: Resistance
SEL: Selector
SW1 to SW4: Switch element The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electromagnetic induction pen comprising:

a resonance circuit that, in operation, transmits a pen signal by using power obtained from an alternating magnetic field sent out by a position detecting device, wherein the resonance circuit includes:

a node;

a first capacitor connected between the node and a grounding terminal;

a selector including a common terminal and a plurality of selection terminals, wherein the selector, in operation, receives a selection signal and selectively connects the common terminal to one of the selection terminals based on the selection signal;

a switch element connected between the node and the common terminal of the selector; and a plurality of second capacitors, wherein each of the second capacitors is connected between a corresponding one of the selection terminals of the selector and a ground terminal; and a control circuit that, in operation, causes the resonance circuit to transmit the pen signal phase-modulated according to information to be transmitted to the position detecting device, by supplying to the switch element a control signal that is generated based on the information, wherein the control signal causes the switch element to switch between an on state and an off state, and by generating the selection signal based on the information and supplying the selection signal to the selector, wherein the selection signal causes the selector to change a resonance frequency of the resonance circuit from a first frequency to a second frequency different from the first frequency and then return the resonance frequency of the resonance circuit to the first frequency.

2. The electromagnetic induction pen according to claim 1, wherein the pen signal phase-modulated according to the information is a signal that oscillates at the first frequency.

3. The electromagnetic induction pen according to claim 1, wherein the control circuit, in operation, changes the resonance frequency of the resonance circuit from the first frequency to the second frequency based on the information by changing a combined capacitance of the first capacitor and the plurality of the second capacitors from a first capacitance to a second capacitance different from the first capacitance based on the information after sending of the alternating magnetic field by the position detecting device is ended.

4. The electromagnetic induction pen according to claim 3, wherein the control circuit includes a processing circuit that, in operation, controls the selection signal based on the information.

5. The electromagnetic induction pen according to claim 4, wherein the resonance circuit includes a coil that is connected to the node, the first capacitor is connected in parallel with the coil, and the control circuit includes a modulation circuit that, in operation, changes the combined capacitance from the first capacitance to the second capacitance by turning on the switch element and changes the combined capacitance from the second capacitance to the first capacitance by turning off the switch element.

6. The electromagnetic induction pen according to claim 5, wherein the modulation circuit, in operation, performs on-off control of the switch element at a timing at which the pen signal becomes 0.

7. The electromagnetic induction pen according to claim 4, wherein the resonance circuit includes a coil that is connected to the node, the resonance circuit includes a decoupling capacitor that is coupled to the node, wherein the decoupling capacitor, in operation, adds a direct-current component to an output of the resonance circuit and supplies the output to which the direct-current component is added to the processing circuit, and the control circuit includes a modulation circuit that, in operation, changes the combined capacitance from the first capacitance to the second capacitance by turning on the switch element and changes the combined capacitance from the second capacitance to the first capacitance by turning off the switch element.

8. The electromagnetic induction pen according to claim 3, wherein the control circuit includes a processing circuit that, in operation, controls a length of a period during which the combined capacitance is maintained at the second capacitance based on the information.

9. The electromagnetic induction pen according to claim 8, wherein the resonance circuit includes a decoupling capacitor that is coupled to the node, wherein the decoupling capacitor, in operation, adds a direct-current component to an output of the resonance circuit and supplies the output to which the direct-current component is added to the processing circuit, and the control circuit includes a modulation circuit that, in operation, changes the combined capacitance from the first capacitance to the second capacitance by turning off the switch element and changes the combined capacitance from the second capacitance to the first capacitance by turning on the switch element.

10. The electromagnetic induction pen according to claim 9, wherein the processing circuit, in operation, controls the length of the period during which the combined capacitance is maintained at the second capacitance based on the information, by controlling a length of a period during which the modulation circuit maintains the switch element in an off state based on the information.

11. The electromagnetic induction pen according to claim 8, wherein the resonance circuit includes a decoupling capacitor that is coupled to the node, wherein the decoupling capacitor, in operation, adds a direct-current component to an output of the resonance circuit and supplies the output to which the direct-current component is added to the processing circuit, and the control circuit includes a modulation circuit that, in operation, changes the combined capacitance from the first capacitance to the second capacitance by turning on the switch element and changes the combined capacitance from the second capacitance to the first capacitance by turning off the switch element.

12. The electromagnetic induction pen according to claim 11, wherein the processing circuit controls the length of the period during which the combined capacitance is maintained at the second capacitance based on the information, by controlling a length of a period during which the modulation circuit maintains the switch element in an on state based on the information.

13. The electromagnetic induction pen according to claim 3, wherein the control circuit includes:

a modulation circuit that, in operation, returns the combined capacitance to the first capacitance after a predetermined time after the combined capacitance is changed to the second capacitance, and a processing circuit that, in operation, controls a timing at which the modulation circuit changes the combined capacitance to the second capacitance based on the information.

14. The electromagnetic induction pen according to claim 13, wherein the resonance circuit includes a coil that is connected to the node, the first capacitor is connected in parallel with the coil, the first capacitor, in operation, is connected in parallel with one of the plurality of second capacitors is connected in parallel with the first capacitor via the switch element and the selector, and the modulation circuit, in operation, charges the combined capacitance by turning on the switch element before the sending of the alternating magnetic field by the position detecting device is ended, and temporarily changes the combined capacitance from the first capacitance to the second capacitance by signaling the control circuit to change the selection signal after the sending out of the alternating magnetic field by the position detecting device is ended.

15. The electromagnetic induction pen according to claim 14, wherein the processing circuit, in operation, controls a timing at which the modulation circuit changes the combined capacitance to the second capacitance based on the information, by controlling a timing at which the modulation circuit signals the control circuit to change the selection signal based on the information.

16. A position detecting device, comprising:

a plurality of loop coils; and a sensor controller that, in operation, sends out an alternating magnetic field of a first frequency by using at least one of the loop coils, and after stopping sending out the alternating magnetic field, demodulates information transmitted by an electromagnetic induction pen, based on a phase of a signal of the first frequency detected within a pen signal detection period using a table that stores information regarding the phase of the signal in association with information indicating a plurality of bits.

17. The position detecting device, according to claim 16, wherein the plurality of bits consists of at least four bits.

* * * * *